US012658269B2

(12) United States Patent
Kim et al.

(10) Patent No.: US 12,658,269 B2
(45) Date of Patent: Jun. 16, 2026

(54) STORAGE DEVICE AND OPERATING METHOD THEREOF

(71) Applicant: SAMSUNG ELECTRONICS CO., LTD., Suwon-si (KR)

(72) Inventors: Youhwan Kim, Suwon-si (KR); Kyungduk Lee, Suwon-si (KR); Suyong Jang, Suwon-si (KR); Hankyu Ko, Suwon-si (KR); Ho-Sung Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 70 days.

(21) Appl. No.: 18/598,988

(22) Filed: Mar. 7, 2024

(65) Prior Publication Data

US 2025/0014658 A1 Jan. 9, 2025

(30) Foreign Application Priority Data

Jul. 3, 2023 (KR) ........................ 10-2023-0085855

(51) Int. Cl.
*G11C 16/34* (2006.01)
*G11C 16/10* (2006.01)
(Continued)

(52) U.S. Cl.
CPC ........ *G11C 16/3495* (2013.01); *G11C 16/102* (2013.01); *G11C 16/16* (2013.01); *G11C 16/28* (2013.01)

(58) Field of Classification Search
CPC ... G11C 16/3495; G11C 16/102; G11C 16/16; G11C 16/28
(Continued)

(56) References Cited

U.S. PATENT DOCUMENTS 5,912,836 A 6/1999 Liu et al.
7,535,787 B2 5/2009 Elmhurst et al.
(Continued)

FOREIGN PATENT DOCUMENTS

KR 10-2008-0082358 9/2008

OTHER PUBLICATIONS

Kim et al., "SARO: A State-Aware Reliability Optimization Technique for High Density NAND Flash Memory," GLSVLSI '18: Proceedings of the 2018 Great Lakes Symposium on VLSI, May 2018, pp. 255-260.

*Primary Examiner* — Amir Zarabian
*Assistant Examiner* — Daniel John King
(74) *Attorney, Agent, or Firm* — Fish & Richardson P.C.

(57) ABSTRACT

The present disclosure relates to storage devices. An example storage device includes a nonvolatile memory device that includes a plurality of memory blocks, and a memory controller that controls the nonvolatile memory device. The memory controller performs a soft erase operation on a first memory block among the plurality of memory blocks, measures a first cell count by applying a first reference voltage to a plurality of first memory cells selected in advance from a plurality of memory cells of the first memory block after performing the soft erase operation, generates a first health index associated with a retention characteristic of the first memory block based on the first cell count, and performs a reliability management operation on the first memory block based on the first health index.

20 Claims, 19 Drawing Sheets

(51) Int. Cl.
　　G11C 16/16　　　　(2006.01)
　　G11C 16/28　　　　(2006.01)
(58) Field of Classification Search
　　USPC ...................................................... 365/185.09
　　See application file for complete search history.

(56)　　　　　　　　References Cited

U.S. PATENT DOCUMENTS

| | | |
|---|---|---|
| 7,583,536 B2 | 9/2009 | Iioka et al. |
| 9,741,441 B2 | 8/2017 | Kim et al. |
| 10,832,778 B1 | 11/2020 | Yang et al. |
| 2018/0190356 A1 | 7/2018 | Lee et al. |
| 2019/0129655 A1 | 5/2019 | Lee et al. |
| 2021/0004282 A1* | 1/2021 | Kim ................... G06F 12/0246 |
| 2022/0044758 A1 | 2/2022 | Son et al. |
| 2022/0392516 A1 | 12/2022 | Cha et al. |
| 2022/0415420 A1* | 12/2022 | Park ....................... G11C 16/32 |
| 2023/0017995 A1 | 1/2023 | Xu et al. |
| 2023/0393938 A1* | 12/2023 | Rayaprolu .......... G06F 11/0772 |

* cited by examiner

FIG. 2

BLK

Height
Direction

Column
Direction

Row
Direction

| Block | Health Index |
|-------|--------------|
| BLK1 | A |
| BLK2 | C |
| ⋮ | ⋮ |
| BLKn | D |

| Cell Count | Health Index | Patrol Read Cycle |
|------------|--------------|-------------------|
| 0~99 | A | 14 days |
| 100~199 | B | 10 days |
| 200~299 | C | 7 days (Default) |
| 300~399 | D | 4 days |
| 400~499 | E | 1 days |
| 500~ | F | Treated as RTBB |

Figure 13:
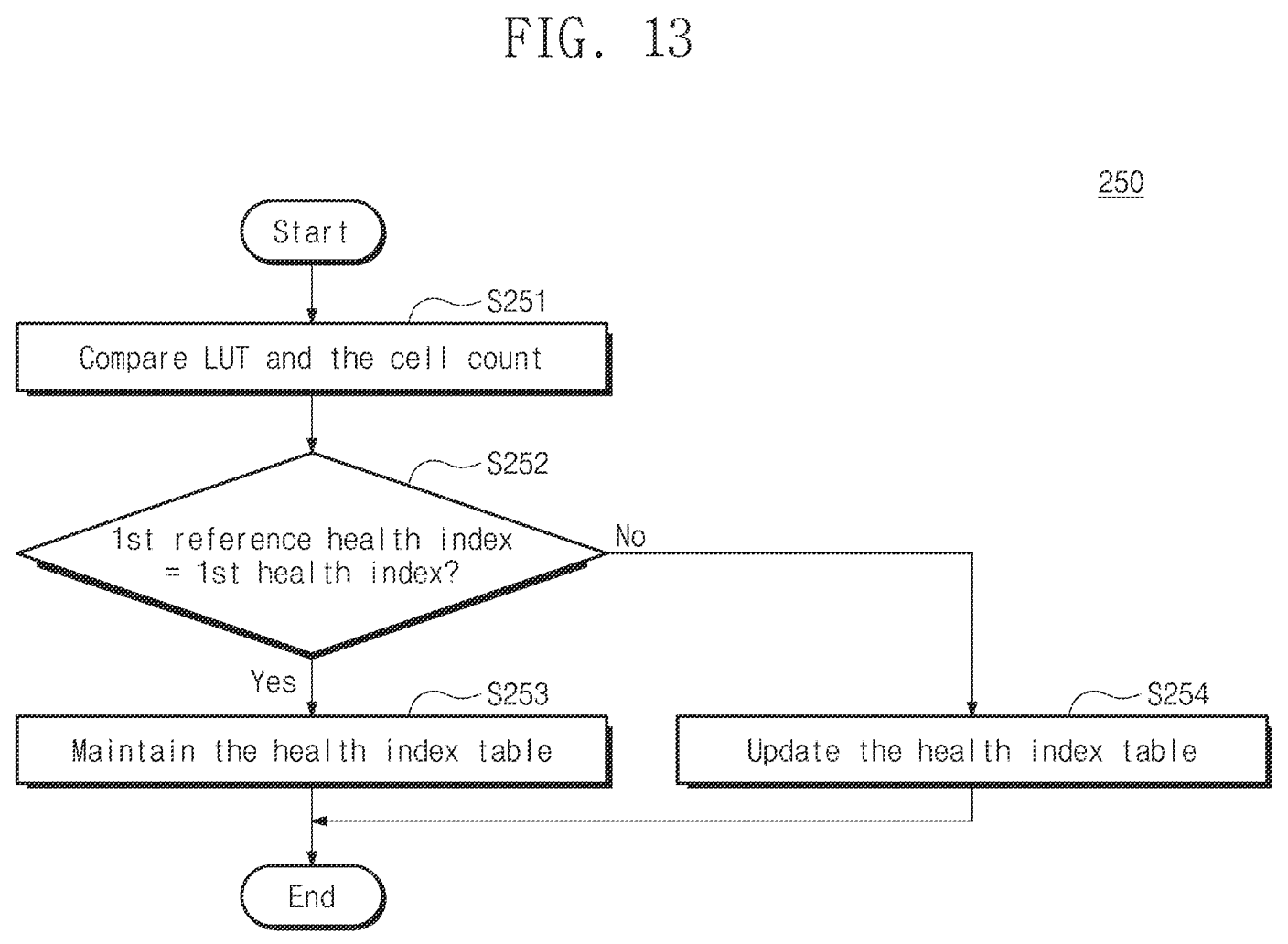

Start

S251

Compare LUT and the cell count

S252

1st reference health index = 1st health index?

No → S254 Update the health index table

Yes → S253 Maintain the health index table

End

| Cell Count | Health Index | Patrol Read Cycle |
|------------|--------------|-------------------|
| 0~99 | A | 14 days |
| 100~199 | B | 10 days |
| 200~299 | C | 7 days (Default) |
| 300~399 | D | 4 days |
| 400~499 | E | 1 days |
| 500~ | F | Treated as RTBB |

BLK1       BLK2       122

| R1(NE) |
| :---: |
| R2(NE) |

| R3(NE) |
| :---: |
| R4(NE) |

| Block | Health Index |
| :---: | :---: |
| BLK1 | C |
| BLK2 | C |

⇩

BLK1       BLK2       122

| R1(valid) |
| :---: |
| R2(invalid) |

| R3(valid) |
| :---: |
| R4(NE) |

| Block | Health Index |
| :---: | :---: |
| BLK1 | C |
| BLK2 | C |

⇩

BLK1       BLK2       122

| R1(invalid) |
| :---: |
| R2(invalid) |

| R3(valid) |
| :---: |
| R4(P7) |

| Block | Health Index |
| :---: | :---: |
| BLK1 | C |
| BLK2 | C |

⇩

BLK1       BLK2       122

| R1(SE) |
| :---: |
| R2(SE) |

| R3(valid) |
| :---: |
| R4(P7) |

| Block | Health Index |
| :---: | :---: |
| BLK1 | D |
| BLK2 | B |

STORAGE DEVICE AND OPERATING METHOD THEREOF

CROSS-REFERENCE TO RELATED APPLICATION

This application claims priority under 35 U.S.C. § 119 to Korean Patent Application No. 10-2023-0085855 filed on Jul. 3, 2023, in the Korean Intellectual Property Office, the disclosure of which are incorporated by reference herein in its entirety.

BACKGROUND

A flash memory device is widely used as high-capacity storage of a computing system. The flash memory device may store data based on threshold voltages of memory cells. However, threshold voltages of memory cells may change due to various factors. As such, an error may occur in the data stored in the memory cells.

A memory block that includes memory cells where data are stored may be left alone for a long time. In this case, the memory block may be determined as a runtime bad block (RTBB) due to an error caused by the threshold voltage change.

A storage device may perform reliability management operations for managing the reliability of data stored in the memory block. The flash memory device may include memory blocks. The memory blocks may have different retention characteristics due to a process deviation of the memory blocks. Accordingly, when the reliability management operations are performed with respect to all the memory blocks under the same condition, the performance of the storage device may be reduced.

SUMMARY

The present disclosure relates to storage devices, including a storage device with improved performance and improved reliability by managing memory blocks individually, and operating methods thereof.

In general, according to some aspects, a storage device includes a nonvolatile memory device that includes a plurality of memory blocks, and a memory controller that controls the nonvolatile memory device. The memory controller performs a soft erase operation on a first memory block among the plurality of memory blocks, measures a first cell count by applying a first reference voltage to first memory cells determined in advance from among first memory cells of the first memory block after performing the soft erase operation, generates a first health index associated with a retention characteristic of the first memory block, based on the first cell count, and performs a reliability management operation on the first memory block based on the first health index.

In general, according to some other aspects, an operating method of a storage device which includes a memory controller controlling a nonvolatile memory device including a plurality of memory blocks includes performing a pre-program operation on a first memory block among the plurality of memory blocks, performing a soft erase operation on the first memory block, measuring a first cell count by applying a first reference voltage to first memory cells determined in advance from among first memory cells of the first memory block, generating a first health index associated with a retention characteristic of the first memory block based on the first cell count, and performing a reliability management operation on the first memory block based on the first health index.

In general, according to some other aspects, a storage device includes a nonvolatile memory device that includes a plurality of memory blocks, and a memory controller that controls the nonvolatile memory device. The memory controller includes a health index table that includes reference health indexes corresponding to the plurality of memory blocks, and a health index lookup table that includes reference values. The memory controller performs a pre-program operation on a first memory block among the plurality of memory blocks, performs a soft erase operation on the first memory block after performing the pre-program operation, measures a first cell count by applying a first reference voltage to first memory cells determined in advance from among first memory cells of the first memory block after performing the soft erase operation, generates a first health index associated with a retention characteristic of the first memory block based on the first cell count and the reference values, compares the first health index with a first reference health index corresponding to the first memory block from among the reference health indexes, updates the first reference health index to the first health index, based on the comparison result, and performs a reliability management operation on the first memory block based on the first health index.

BRIEF DESCRIPTION OF THE FIGURES

The above and other objects and features of the present disclosure will become apparent by describing in detail implementations thereof with reference to the accompanying drawings.

FIG. 2 is a block diagram illustrating an example of a memory controller of FIG. 1 in detail.

FIGS. 8 and 9 are diagrams for describing operation S110 of FIG. 7.

FIG. 13 is a flowchart illustrating operation S250 of FIG. 10 in detail.

DETAILED DESCRIPTION

Hereinafter, implementations of the present disclosure will be described in detail and clearly to such an extent that one skilled in the art easily carries out the present disclosure. Details such as detailed components and structures are provided only for the overall understanding of implementations of the present disclosure. Therefore, modifications of the implementations disclosed herein may be made by one skilled in the art without departing from the spirit and scope of the technology described herein. Moreover, descriptions of well-known functions and structures are omitted for clarity and conciseness. In the following drawings or in the detailed description, components may be connected to any other components except for components illustrated in a drawing or described in the detailed description. Terms used in the specification are terms defined in consideration of functions of the present disclosure and are not limited thereto. The definition of the terms should be determined based on the content throughout the specification.

In the detailed description, components that are described with reference to the terms "driver", "block", "unit", etc. will be implemented with software, hardware, or a combination thereof. For example, the software may be a machine code, firmware, an embedded code, or application software. For example, the hardware may include an electrical circuit, an electronic circuit, a processor, a computer, integrated circuit cores, a pressure sensor, an inertial sensor, a micro electro mechanical system (MEMS), a passive element, or a combination thereof.

Figure 1:
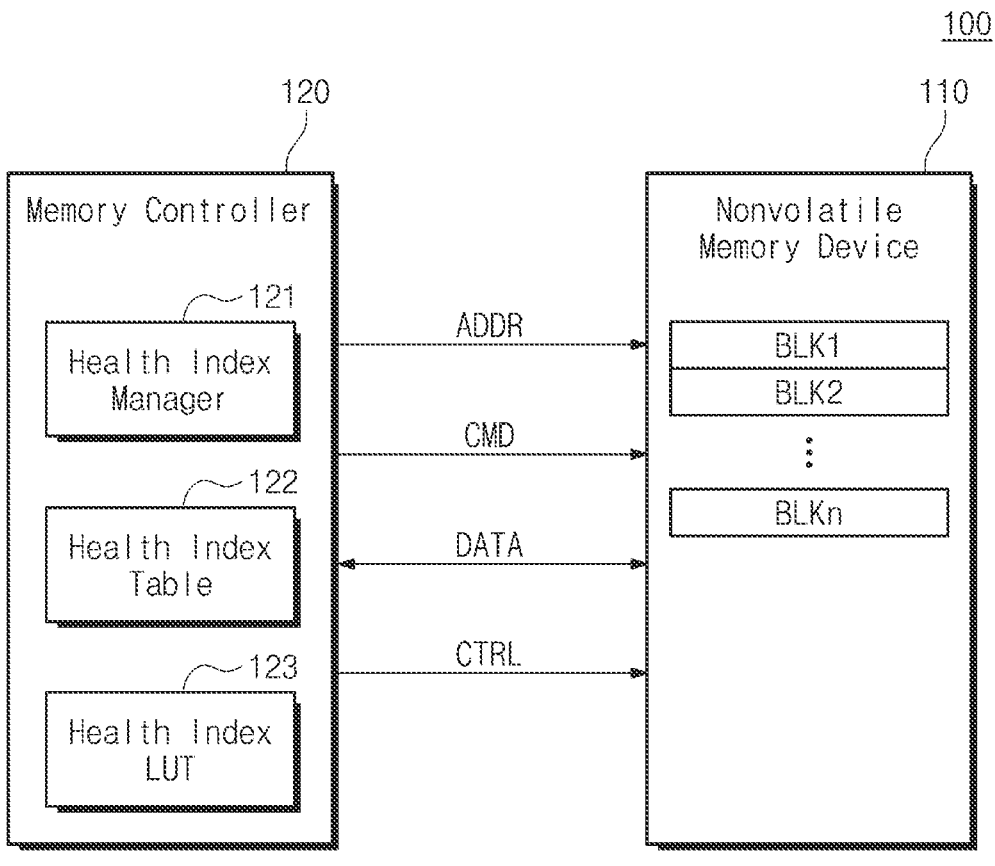
FIG. 1 is a block diagram illustrating an example of a storage device according to an implementation of the present disclosure.

FIG. 1 is a block diagram illustrating an example of a storage device according to an implementation of the present disclosure. Referring to FIG. 1, a storage device 100 includes a nonvolatile memory device 110 and a memory controller 120.

The memory controller 120 may store data "DATA" in the nonvolatile memory device 110 or may read the data "DATA" stored in the nonvolatile memory device 110. For example, the memory controller 120 may transmit a command CMD, an address ADDR, and a control signal CTRL to the nonvolatile memory device 110 and may read the data "DATA" stored in the nonvolatile memory device 110; alternatively, the memory controller 120 may transmit the command CMD, the address ADDR, the control signal CTRL, and the data "DATA" to the nonvolatile memory device 110 such that the data "DATA" are stored in the nonvolatile memory device 110.

The nonvolatile memory device 110 may receive the command CMD and the address ADDR from the memory controller 120. The nonvolatile memory device 110 may operate in response to the received signals. For example, when the command CMD received from the memory controller 120 is a read command, the nonvolatile memory device 110 may return the data "DATA" to the memory controller 120. When the command CMD received from the memory controller 120 is a program command, the nonvolatile memory device 110 may store the data "DATA" received from the memory controller 120.

Below, an implementation in which the nonvolatile memory device 110 is a flash memory device and the storage device 100 is a solid state drive (SSD) will be described representatively. However, the present disclosure is not limited thereto.

The nonvolatile memory device 110 may include a plurality of memory blocks BLK1 to BLKn. Each of the plurality of memory blocks BLK1 to BLKn may include a plurality of memory cells. The read or program operation of the plurality of memory cells may be made based on a word line. In detail, the read or program operation of the plurality of memory cells may be made in units of page. Each of the plurality of memory blocks may be erased in units of block. In some implementations, each of the memory cells may be implemented with a charge trap flash (CTF) memory cell.

For example, the threshold voltages of the memory cells may change due to various factors. As the threshold voltages of memory cells change, an error may occur in the data stored in the memory cells.

For example, the variations in the threshold voltages of the memory cells may be determined based on a retention characteristic. The retention characteristic may be associated with how long data are maintained without loss after the data are stored in the memory cell. Due to a process characteristic of the nonvolatile memory device 110, the retention characteristic of the first memory block BLK1 may be different from the retention characteristic of the second memory block BLK2.

For example, when a charge loss phenomenon occurs, the threshold voltage of the programmed memory cell may decrease. The charge loss phenomenon may mean that the threshold voltage of the memory cell decreases as charges stored in the memory cell are leaked out over time from the programmed point in time. The retention characteristic may be determined based on how much charges are lost in the memory block for a specific time (i.e., based on a charge loss amount).

For example, the retention characteristic of the second memory block BLK2 may be better than the retention characteristic of the first memory block BLK1. In this case, as a time passes from the programmed point in time, the amount of charges lost in the memory cells of the first memory block BLK1 may be greater than the amount of charges lost in the memory cells of the second memory block BLK2. As such, the decrement of the threshold voltages of the memory cells in the first memory block BLK1 may be greater than the decrement of the threshold voltages of the memory cells in the second memory block BLK2. Accordingly, after the same time passes from the programmed point in time, a data error rate of the first memory block BLK1 may be greater than a data error rate of the second memory block BLK2.

The memory controller 120 may perform various reliability management operations for the purpose of managing the reliability of the data "DATA" stored in the nonvolatile memory device 110. For example, the reliability management operations may include a garbage collection operation, a read reclaim operation, a patrol read operation, etc. However, the present disclosure is not limited thereto.

The garbage collection operation refers to an operation of securing a free block in the nonvolatile memory device 110 through a way to copy valid data of a first memory block to a second block as a new block and then invalidate the data present in the first memory block. For example, the free block may mean a memory block including only invalid data.

The read reclaim operation refers to an operation of moving valid data present in a first memory block to a second memory block before an uncorrectable error occurs in the data stored in the first memory block.

The patrol read operation refers to an operation of searching the memory blocks for a read reclaim target block target for the read reclaim operation. For example, the patrol read operation may include performing the read operation on preset memory cells among memory cells of a specific memory block, measuring a data error rate, and determining whether the specific memory block is the read reclaim target block, based on the error rate.

To minimize unnecessary operations such that the performance of the storage device 100 is improved, for example, the memory controller 120 may need to perform the patrol read operation at a point in time close to a point in time when the uncorrectable error occurs in data stored in a memory block.

For example, the memory controller 120 may perform the patrol read operation for each of the memory blocks BLK1 to BLKn, periodically (or at the same period). For example, when a reference time passes from a point in time when the storage device 100 is powered on, the memory controller 120 may perform the patrol read operations on the memory blocks BLK1 to BLKn. However, as already described above, the retention characteristic of the second memory block BLK2 may be better than the retention characteristic of the first memory block BLK1. In this case, when the reference time passes from the point in time when the storage device 100 is powered on, the data error rate of the first memory block BLK1 may be at a level where the read reclaim is required, and the data error rate of the second memory block BLK2 may be at a level where the read reclaim is not required. Even though the error rate of the second memory block BLK2 is low, the memory controller 120 may unnecessarily perform the patrol read operation on the second memory block BLK2. In this case, the performance of the storage device 100 may be reduced.

In some implementations, the memory controller 120 may include a health index manager 121, a health index table 122, and a health index lookup table (hereinafter, referred to as an "LUT") 123.

The health index manager 121 may generate health indexes corresponding to the memory blocks BLK1 to BLKn. The health indexes may be associated with the retention characteristic of memory blocks.

The health index manager 121 may measure a cell count of a memory block based on a reference voltage. The health index manager 121 may generate a health index corresponding to a memory block based on the measured cell count and the LUT 123. The health index manager 121 may compare a current health index and a past health index for each memory block and may update the health index table 122 based on a comparison result.

In some implementations, the health index manager 121 may measure a cell count of a memory block where a soft erase operation is performed. For example, the soft erase operation may mean an operation of discharging only some of charges stored in the memory block. The memory cells of the memory block where the soft erase operation is performed may form a relatively high threshold voltage distribution, compared to the case where a normal erase operation is performed. The soft erase operation will be described in detail with reference to the following drawings.

In some implementations, the health index manager 121 may measure a cell count of a memory block where a dummy close operation is performed. The dummy close operation may mean an operation of programming dummy data in memory cells that are not programmed. The dummy close operation will be described in detail with reference to the following drawings.

The health index table 122 may include the health indexes corresponding to the memory blocks BLK1 to BLKn of the nonvolatile memory device 110.

The LUT 123 may include a plurality of reference values. For example, the LUT 123 may include information of a relationship between health indexes and cell counts and information of a relationship between reliability management operation conditions and health indexes. In some implementations, the reliability management operation conditions may include a patrol read execution condition and/or a read reclaim entry condition.

The health index table 122 and the LUT 123 will be described in detail with reference to FIGS. 8 and 9.

In some implementations, the memory controller 120 may perform the reliability management operation for each memory block based on the health indexes. For example, the retention characteristic of the second memory block BLK2 may be better than the retention characteristic of the first memory block BLK1. The memory controller 120 may check the retention characteristics of the first memory block BLK1 and the second memory block BLK2 with reference to the health index table 122 and the LUT 123.

For example, the memory controller 120 may determine patrol read cycles of the first memory block BLK1 and the second memory block BLK2 with reference to the health index table 122 and the LUT 123. The memory controller 120 may perform the patrol read operations on the first memory block BLK1 and the second memory block BLK2, based on the determined patrol read cycles. In this case, the patrol read cycle of the second memory block BLK2 may be longer than the patrol read cycle of the first memory block BLK1.

In other words, in some implementations, the storage device 100 may check the retention characteristic for each of the memory blocks BLK1 to BLKn and may perform the reliability management operation for each memory block based on the retention characteristic of each of the memory blocks BLK1 to BLKn. That is, the storage device 100 may individually manage the memory blocks BLK1 to BLKn based on the health index table 122 and the LUT 123. In this case, the reduction of performance of the storage device 100 may be prevented. Accordingly, in some implementations, the storage device 100 with improved reliability and improved performance may be provided.

Figure 2:
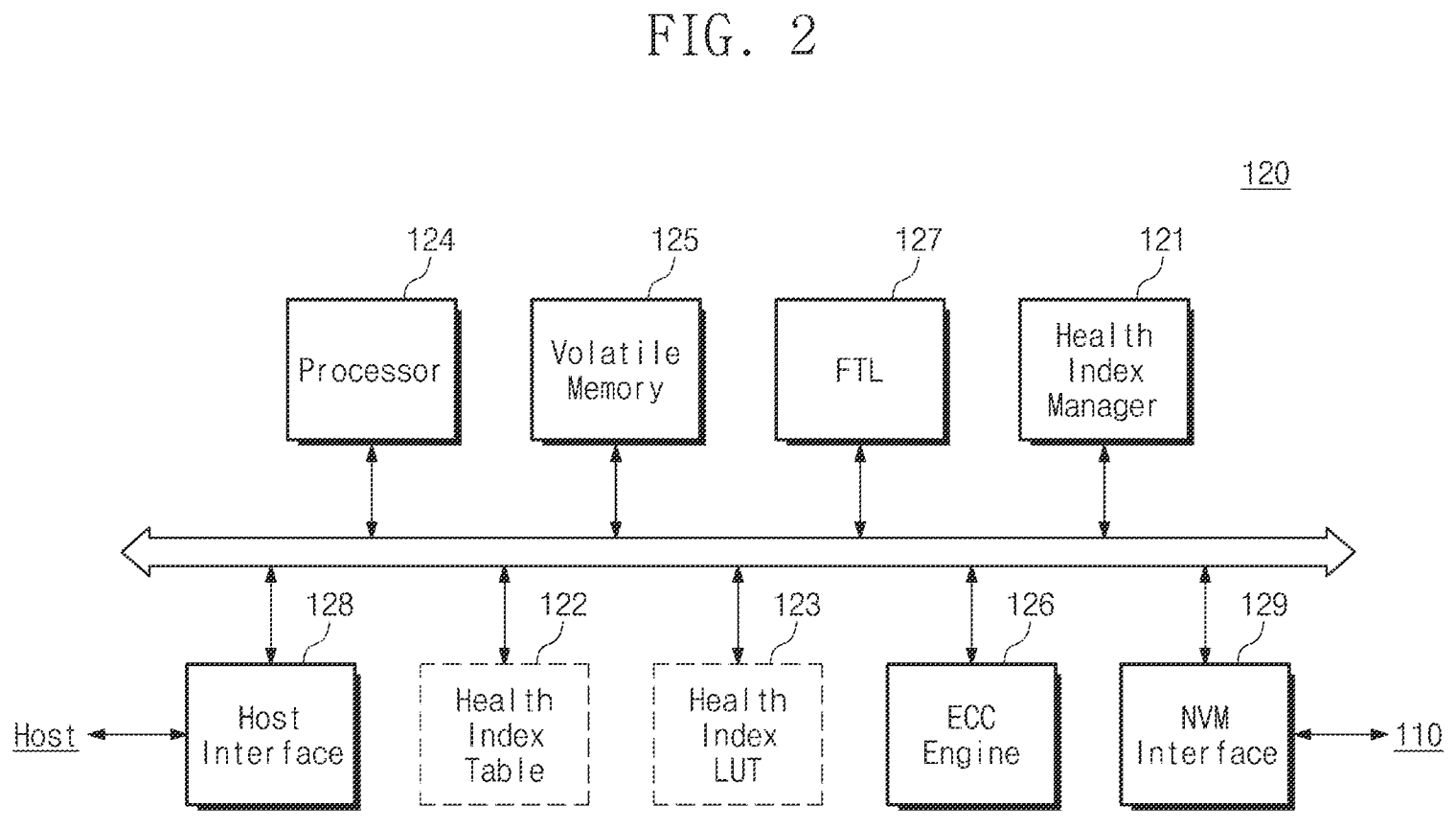

FIG. 2 is a block diagram illustrating an example of a memory controller of FIG. 1 in detail. The memory controller 120 includes the health index manager 121, the health index table 122, the LUT 123, a processor 124, a volatile memory 125, an ECC engine 126, a flash translation layer (FTL) 127, a host interface 128, and a nonvolatile memory (NVM) interface 129.

The health index manager 121, the health index table 122, the LUT 123, the processor 124, the volatile memory 125, the ECC engine 126, the flash translation layer 127, the host interface 128, and the nonvolatile memory interface 129 may be connected to each other through a bus.

The health index manager 121, the health index table 122, and the LUT 123 are described with reference to FIG. 1, and thus, additional description will be omitted to avoid redundancy.

The processor 124 may control an overall operation of the memory controller 120. For example, the health index manager 121 and the FTL 127 may be provided in the form of software and may be driven by the processor 124.

The volatile memory 125 may be used as a main memory, a buffer memory, or a cache memory of the memory controller 120. The volatile memory 125 may temporarily store the read data and the cell count read from the nonvolatile memory device 110. Also, the volatile memory 125 may include information for managing a memory space of the nonvolatile memory device 110 and information about a program/erase cycle, an erase count (EC), and a loop count (LC) of each memory block. In some implementations, the health index table 122 and the LUT 123 may be stored in the volatile memory 125.

The ECC engine 126 may detect and correct an error of data obtained from the nonvolatile memory device 110. For example, the ECC engine 126 may have an error correction capability of a given level. The ECC engine 126 may process data having an error level (e.g., the number of flipped bits) exceeding the error correction capability as an uncorrectable error.

The FTL 127 may perform a role of translating a logical address received from an external device, for example, a host into a physical address used in the nonvolatile memory device 110. Also, the FTL 127 may perform the reliability management operations for the nonvolatile memory device 110. As described with reference to FIG. 1, the reliability management operations may include the garbage collection operation, the read reclaim operation, the patrol read operation, etc.

In some implementations, the health index manager 121 and the FTL 127 may be implemented in the form of firmware. For example, the processor 124 may implement the health index manager 121 and the FTL 127 by loading instructions stored in the nonvolatile memory device 110 to the volatile memory 125 and executing the loaded instructions. However, the present disclosure is not limited thereto. For example, the health index manager 121 and the FTL 127 may be implemented with separate hardware or may be implemented with a combination of hardware and software.

In some implementations, the FTL 127 may implement a function of the health index manager 121. In this case, the above operations of the health index manager 121 may be performed by the FTL 127.

The memory controller 120 may communicate with the host through the host interface 128. In some implementations, the host interface 128 may be implemented based on at least one of various interfaces such as a serial ATA (SATA) interface, a peripheral component interconnect express (PCIe) interface, a serial attached SCSI (SAS), a nonvolatile memory express (NVMe) interface, a universal flash storage (UFS) interface.

The memory controller 120 may communicate with the nonvolatile memory device 110 through the nonvolatile memory interface 129. For example, the nonvolatile memory interface 129 may be implemented based on the NAND interface.

Figure 3:
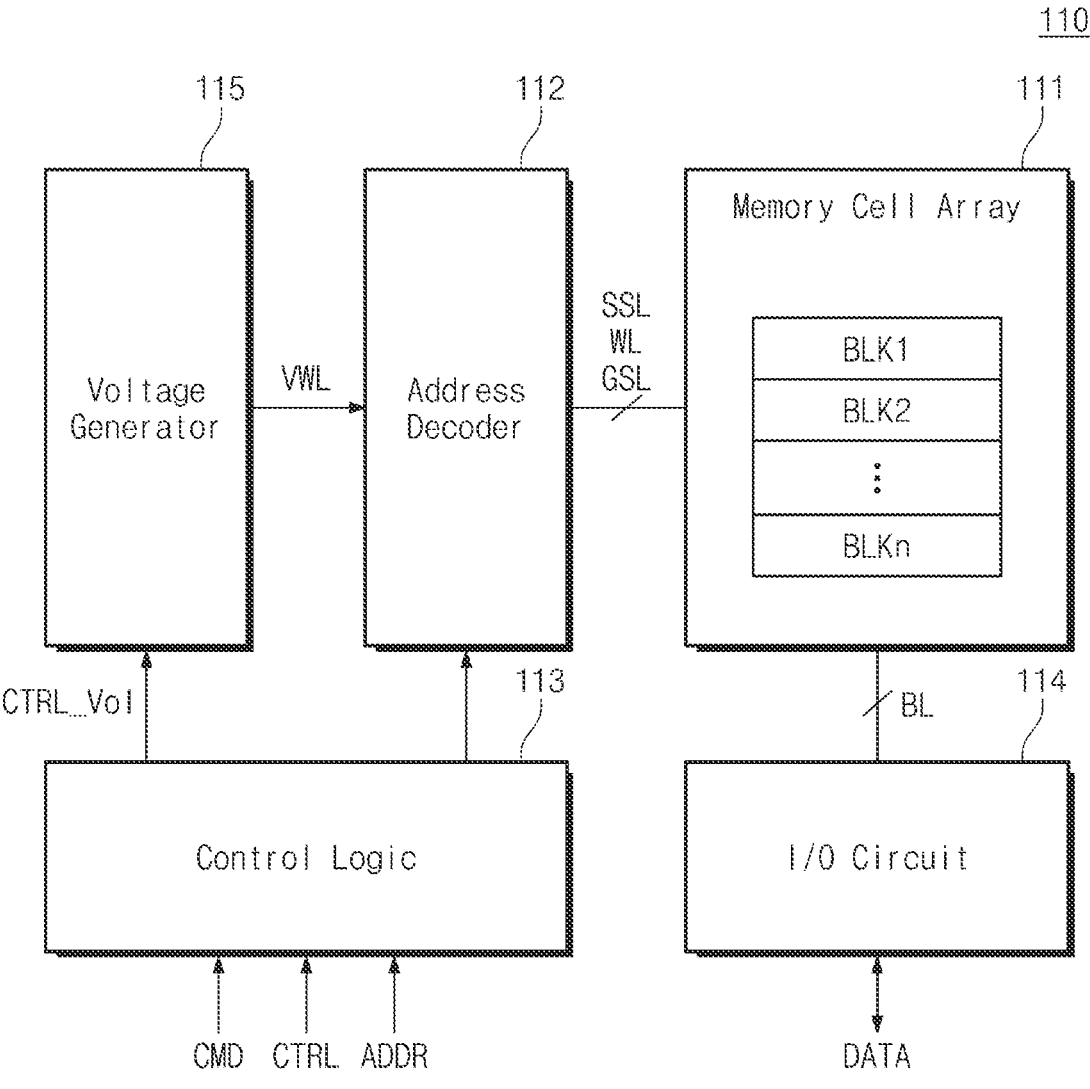
FIG. 3 is a block diagram illustrating an example of a nonvolatile memory device of FIG. 1 in detail.

FIG. 3 is a block diagram illustrating an example of a nonvolatile memory device of FIG. 1 in detail. Referring to FIG. 3, the nonvolatile memory device 110 includes a memory cell array 111, an address decoder 112, control logic 113, an input/output circuit 114, and a voltage generator 115.

The memory cell array 111 may include the plurality of memory blocks BLK1 to BLKn. Each of the plurality of memory blocks BLK1 to BLKn may include a plurality of cell strings that are connected to a plurality of bit lines BL.

Each of the plurality of cell strings may include a plurality of cell transistors connected in series. The plurality of cell transistors may be connected to string selection lines SSL, word lines WL, and ground selection lines GSL.

The address decoder 112 may be connected to the memory cell array 111 through the string selection lines SSL, the word lines WL, and the ground selection lines GSL. The address decoder 112 may control or drive the string selection lines SSL, the word lines WL, and the ground selection lines GSL.

The control logic 113 may control an operation of the nonvolatile memory device 110 in response to the command CMD, the control logic CTRL, and the address ADDR from the memory controller 120. For example, the control logic 113 may control the address decoder 112, the input/output circuit 114, and the voltage generator 115 in response to the command CMD such that an operation (e.g., a program operation, a read operation, an erase operation, or a soft erase operation) corresponding to the command CMD is performed. The control logic 113 may provide a row address to the address decoder 112 and may provide a voltage control signal CTRL_Vol to the voltage generator 115.

The input/output circuit 114 may exchange the data "DATA" with the memory controller 120. The input/output circuit 114 may write the data "DATA" received from the memory controller 120 in the memory cell array 111 or may transfer the data "DATA" read from the memory cell array 111 to the memory controller 120.

The voltage generator 115 may generate various kinds of voltages for performing the write, read, normal erase, and soft erase operations with respect to the memory cell array 111, based on the voltage control signal CTRL_vol. In detail, the voltage generator 115 may be configured to generate a word line voltage VWL, for example, a plurality of program voltages, a plurality of program verify voltages, a plurality of pass voltages, a plurality of read voltages, and a soft erase voltage, etc.

The soft erase voltage may mean a voltage that is applied to the word lines WL connected to memory cells of a memory block when the soft erase operation is performed. For example, the soft erase voltage may be higher than a voltage that is applied to the word lines WL connected to memory cells of a memory block when the normal erase operation is performed.

Figure 4:
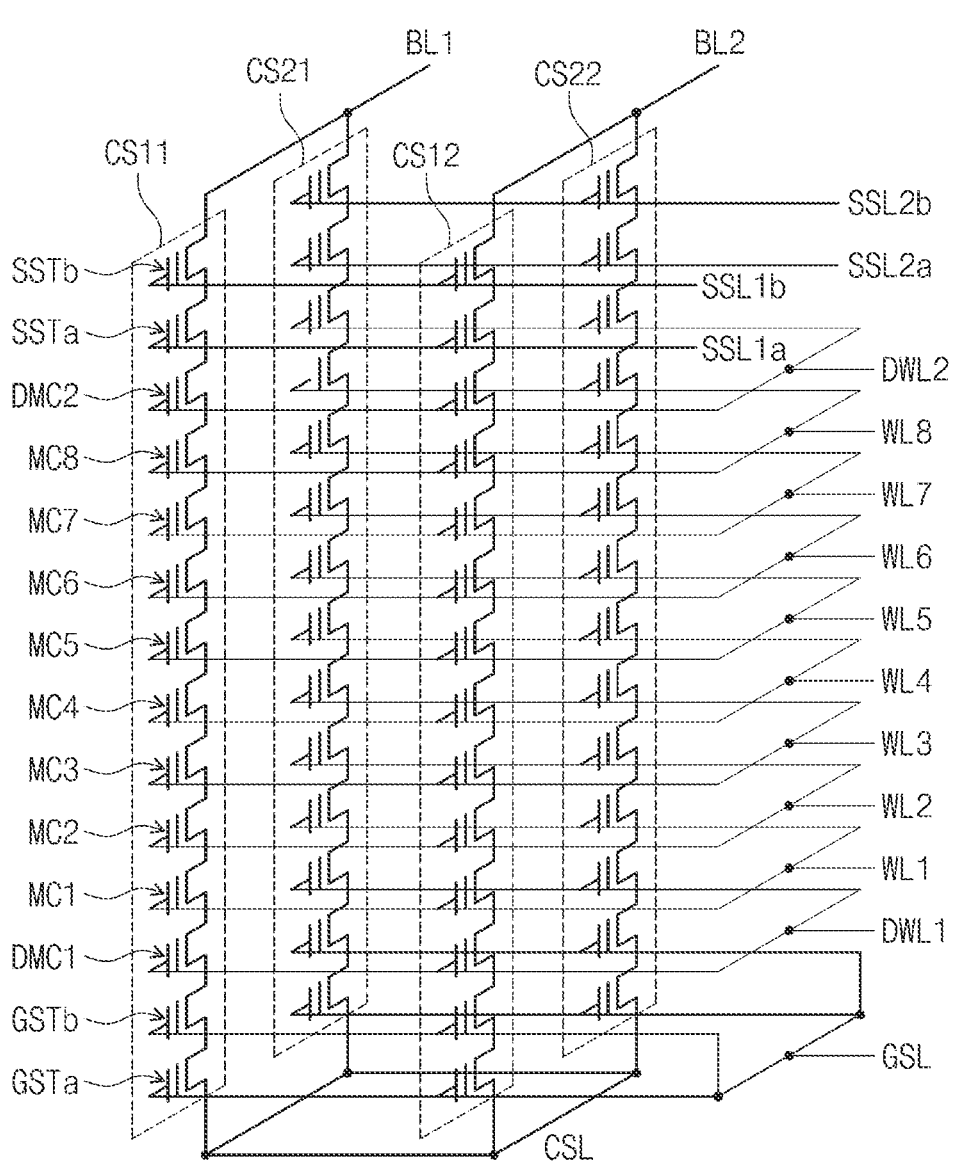
FIG. 4 is a circuit diagram illustrating an example of one memory block among a plurality of memory blocks included in a memory cell array of FIG. 3.
Figure 4:
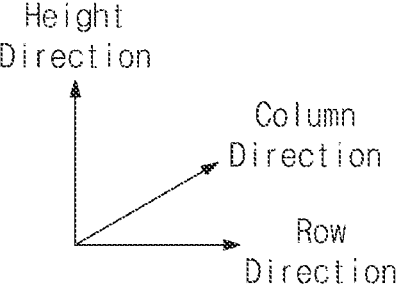

FIG. 4 is a circuit diagram illustrating an example of one memory block among a plurality of memory blocks included in a memory cell array of FIG. 3. One memory block BLK will be described with reference to FIG. 4, but the present disclosure is not limited thereto. The plurality of memory blocks BLK1 to BLKn included in the memory cell array 111 may have a structure that is similar to or the same as that of the memory block BLK of FIG. 4. Referring to FIGS. 3 and 4, the memory block BLK includes a plurality of cell strings CS11, CS12, CS21, and CS22. The plurality of cell strings CS11, CS12, CS21, and CS22 are arranged in a row direction and a column direction.

Cell strings located at the same column from among the plurality of cell strings CS11, CS12, CS21, and CS22 may be connected to the same bit line. For example, the cell strings CS11 and CS21 may be connected to a first bit line BL1, and the cell strings CS12 and CS22 may be connected to a second bit line BL2. Each of the plurality of cell strings CS11, CS12, CS21, and CS22 includes a plurality of cell transistors. Each of the plurality of cell transistors may be a charge trap flash (CTF) memory cell transistor, but the present disclosure is not limited thereto. The plurality of cell transistors may be stacked on a plane (e.g., a semiconductor substrate (not illustrated)) defined by the row direction and the column direction.

The plurality of cell transistors may be connected in series between the corresponding bit line (e.g., BL1 or BL2) and a common source line CSL. For example, the plurality of cell transistors may include string selection transistors SSTa and SSTb, dummy memory cells DMC1 and DMC2, memory cells MC1 to MC8, and ground selection transistors GSTa and GSTb. The serially-connected string selection transistors SSTa and SSTb may be provided or connected between the serially-connected memory cells MC1 to MC8 and the corresponding bit line (e.g., BL1 and BL2). The serially-connected ground selection transistors GSTa and GSTb may be provided or connected between the serially-connected memory cells MC1 to MC8 and the common source line CSL.

Memory cells located at the same height from among the memory cells MC1 to MC8 of the plurality of cell strings CS11, CS12, CS21, and CS22 may share the same word line.

Dummy memory cells located at the same height from among the dummy memory cells DMC1 and DMC2 of the plurality of cell strings CS11, CS12, CS21, and CS22 may share the same dummy word line.

String selection transistors located at the same height and the same row from among the string selection transistors SSTa and SSTb of the plurality of cell strings CS11, CS12, CS21, and CS22 may share the same string selection line.

Although not illustrated, string selection transistors located at the same row from among the string selection transistors SSTa and SSTb of the plurality of cell strings CS11, CS12, CS21, and CS22 may share the same string selection line.

Ground selection transistors placed at the same height and the same row from among the ground selection transistors GSTa and GSTb of the plurality of cell strings CS11, CS12, CS21, and CS22 may be connected to the same ground selection line.

Although not illustrated, the ground selection transistors GSTa and GSTb of the plurality of cell strings CS11, CS12, CS21, and CS22 may share the same ground selection line. Alternatively, ground selection transistors located at the same height from among the ground selection transistors GSTa and GSTb of the plurality of cell strings CS11, CS12, CS21, and CS22 may share the same ground selection line. Alternatively, ground selection transistors located at the same row from among the ground selection transistors GSTa and GSTb of the plurality of cell strings CS11, CS12, CS21, and CS22 may share the same ground selection line.

Figure 5:
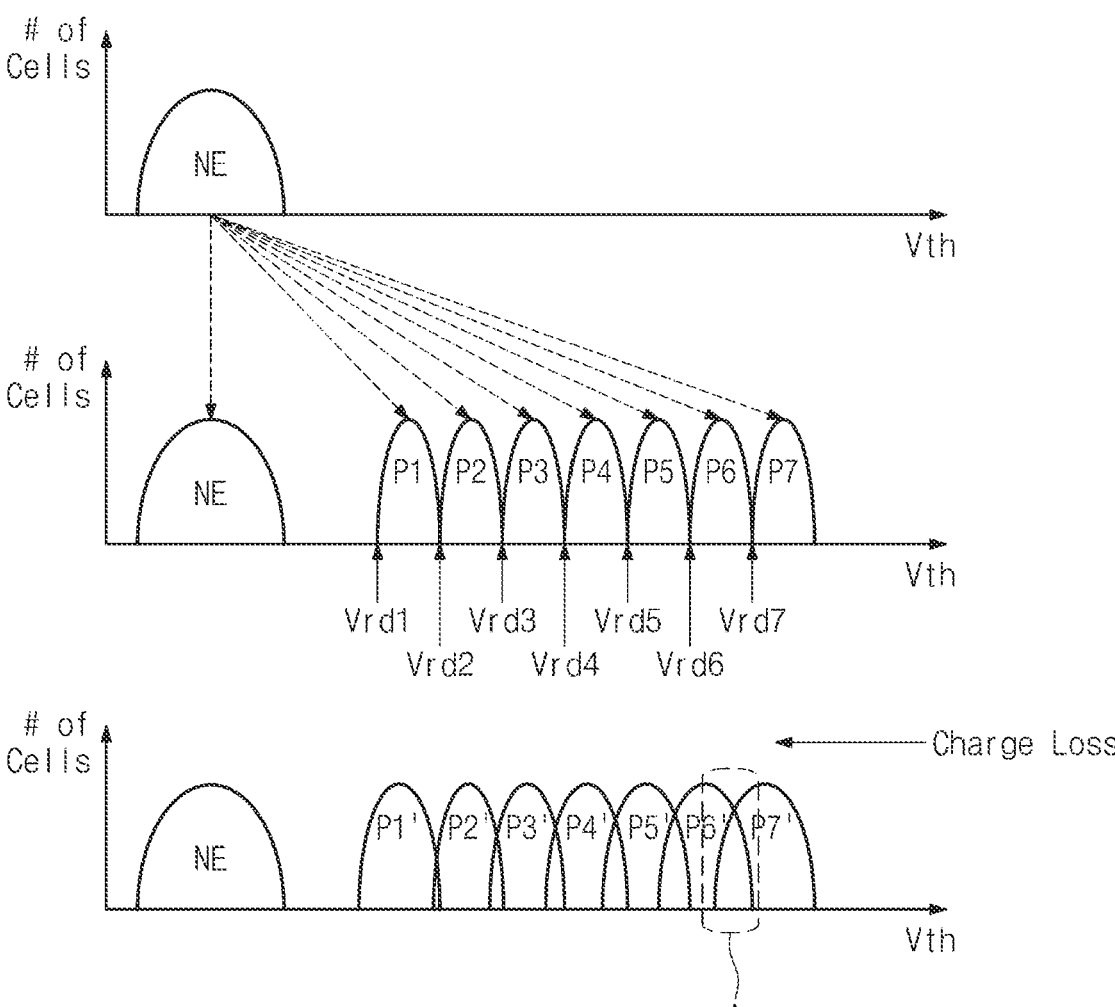
FIG. 5 is a diagram illustrating example threshold voltage distributions of memory cells illustrated in FIG. 4.

FIG. 5 is a diagram illustrating example threshold voltage distributions of memory cells illustrated in FIG. 4. In distribution diagrams of FIG. 5, a horizontal axis represents a threshold voltage of a memory cell, and a vertical axis represents the number of memory cells. For convenience of description, it is assumed that each memory cell is a triple level cell configured to store 3-bit data. However, the present disclosure is not limited thereto. For example, each memory cell is implemented in the form of a single level cell (SLC), a multi-level cell (MLC), a triple level cell (TLC), a quad-level cell (QLC), or a penta-level cell (PLC).

Referring to FIGS. 1 to 5, the memory controller 120 stores data in memory cells by controlling threshold voltages of memory cells of the memory block BLK. For example, each of the memory cells is programmed to have one of a normal erase state NE and a plurality of program states P1 to P7.

The memory controller 120 may read data stored in memory cells by sensing program states (i.e., threshold voltages) of the memory cells by using a plurality of read voltages Vrd1 to Vrd7.

In some implementations, the threshold voltages of the memory cells may change due to various factors (e.g., an elapsed time, a read disturb, a program disturb, and a word line coupling). For example, as described above, as the charge loss occurs in the memory cells, the threshold voltages of the memory cells may decrease.

In this case, as illustrated in FIG. 5, there may be periods where program states P1' to P7' of the memory cells overlap each other. An error may occur in memory cells whose threshold voltages belong to the overlapping period (e.g., region A of FIG. 5) of program states; in this case, the reliability of data stored in the memory cells may be reduced.

As charges stored in the memory cells are leaked out, that is, as the charge loss occurs, the threshold voltages of the memory cells may decrease. In this case, the higher the threshold voltage distribution (or the program state) of memory cells, the greater the charge loss. In detail, for example, when memory cells belong to the uppermost program state P7, the memory cells in the uppermost program state P7 may experience relatively great charge loss during the same time, compared to memory cells belonging to the remaining program states P1 to P6.

Figure 6:
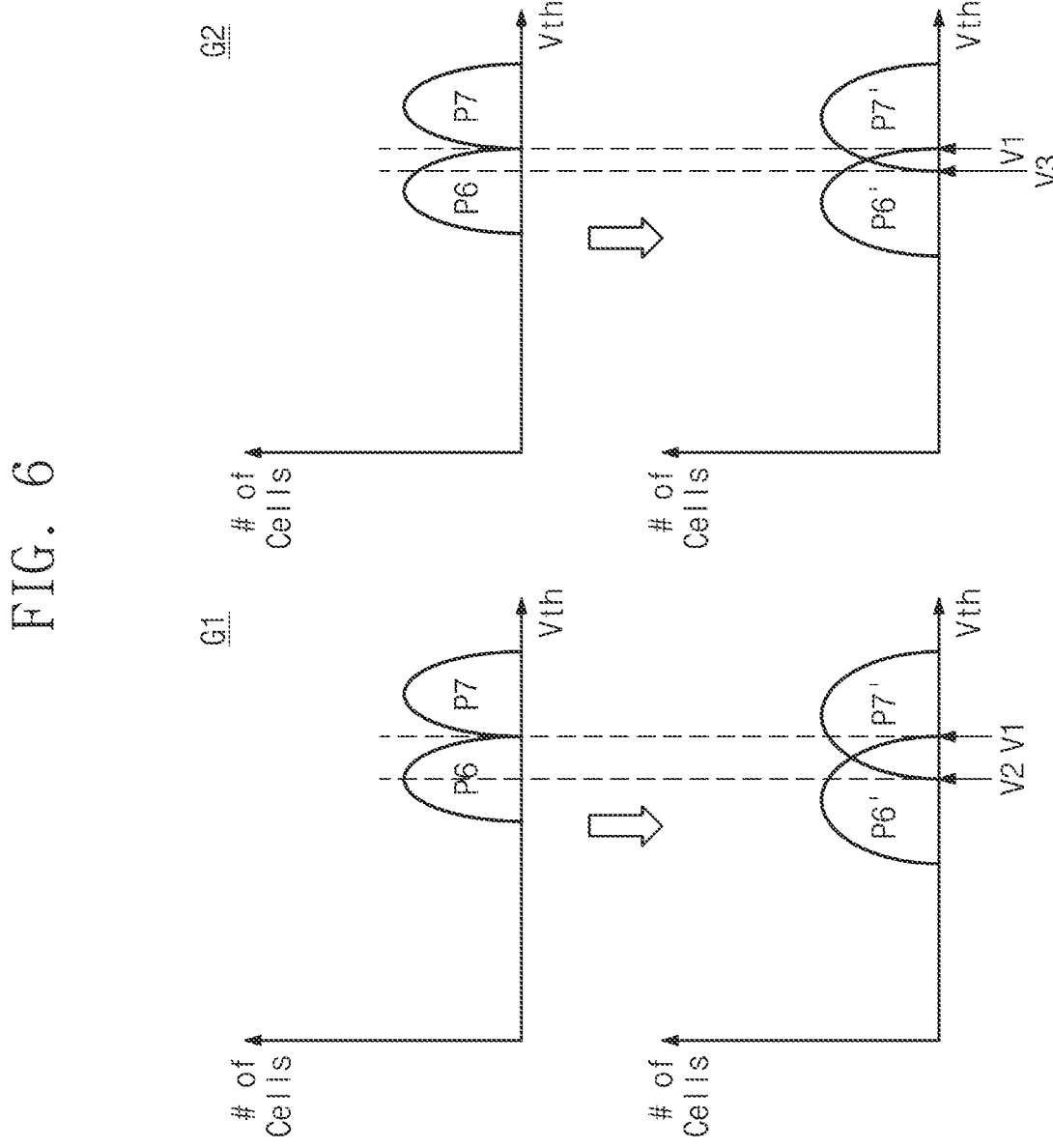
FIG. 6 is a diagram for describing an example retention characteristic difference of memory blocks.

FIG. 6 is a diagram for describing an example retention characteristic difference of memory blocks. FIG. 6 will be described with reference to FIGS. 1 to 5. In distribution diagrams of FIG. 6, a horizontal axis represents a threshold voltage of a memory cell, and a vertical axis represents the number of memory cells. In FIG. 6, a first distribution diagram G1 shows a change in threshold voltage distributions of memory cells that the first memory block BLK1 includes, and a second distribution diagram G2 shows a change in threshold voltage distributions of memory cells that the second memory block BLK2 includes.

The first memory block BLK1 and the second memory block BLK2 may have different retention characteristics due to a process deviation or a difference between degradation levels of memory blocks whose program/erase (P/E) cycle counts are different. In this case, the amount of charge loss occurring over time from the programmed point in time may be differently determined for each memory block.

For example, at a first point in time, the program operation may be performed with respect to the first memory block BLK1 and the second memory block BLK2. For example, at the first point in time, a lower limit of a threshold voltage distribution of the uppermost program state P7 of the memory cells of the first memory block BLK1 and the memory cells of the second memory block BLK2 may correspond to a first voltage V1.

After a first time passes from the first point in time, the lower limit of the uppermost program state P7' of the memory cells of the first memory block BLK1 may correspond to a second voltage V2. Also, the lower limit of the uppermost program state P7' of the memory cells of the second memory block BLK2 may correspond to a third voltage V3.

A difference "V1–V2" between the first voltage V1 and the second voltage V2 may be greater than a difference "V1–V3" between the first voltage V1 and the third voltage V3. That is, while the same time passes from the programmed point in time, the amount of charge loss that occurs in the first memory block BLK1 may be greater than the amount of charge loss that occurs in the second memory block BLK2. As such, after the same time passes from the programmed point in time, an error rate of data stored in the first memory block BLK1 may be higher than an error rate of data stored in the second memory block BLK2. This case may be referred to as a "case where the retention characteristic of the second memory block BLK2 is better than the retention characteristic of the first memory block BLK1".

Because memory blocks have different retention characteristics, the memory controller 120 should differently set an execution condition of the reliability management operations (e.g., the patrol read operation and the read reclaim operation) for each memory block, based on the retention characteristics of the memory blocks. That is, the memory controller 120 may individually manage memory blocks for the purpose of improving the performance of the storage device 100.

Figure 7:
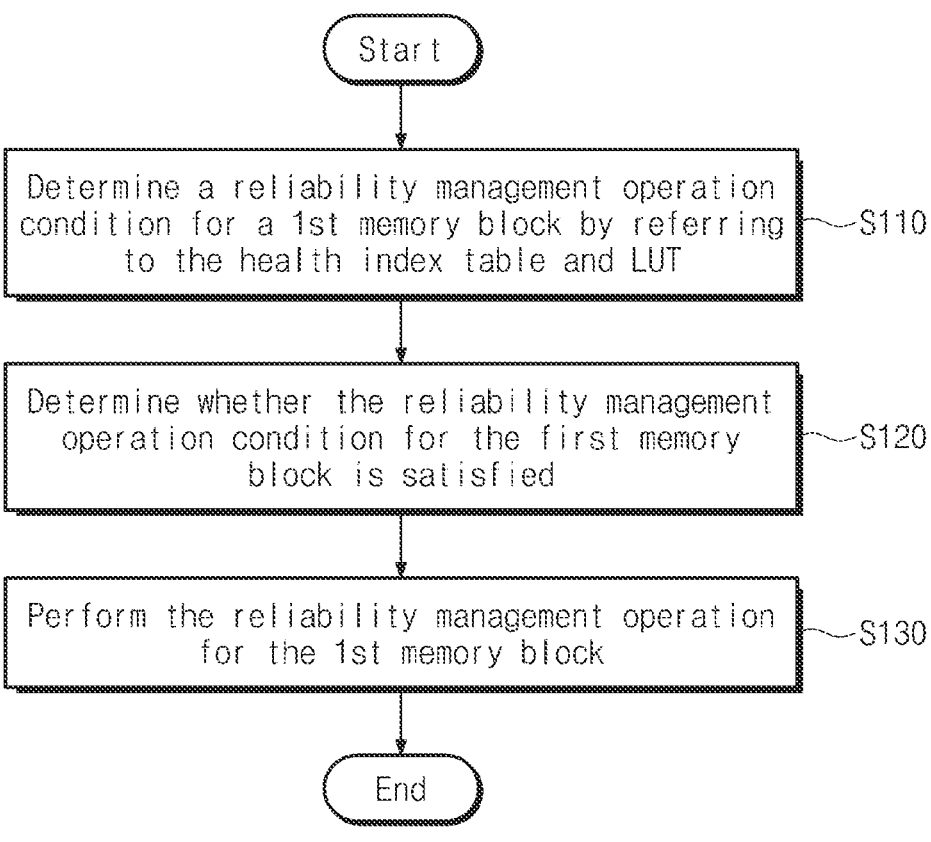
FIG. 7 is a flowchart illustrating an example of an operating method of a storage device of FIG. 1.

FIG. 7 is a flowchart illustrating an example of an operating method of a storage device of FIG. 1. FIG. 7 will be described with reference to FIGS. 1 to 6. Referring to FIG. 7, in operation S110, the storage device 100 determines the reliability management operation condition of the first memory block BLK1 with reference to the health index table 122 and the LUT 123. For example, the storage device 100 checks the health index of the first memory block BLK1 with reference to the health index table 122. The storage device 100 determines the reliability management operation condition of the first memory block BLK1 with reference to the LUT 123. In some implementations, the reliability management operation condition includes the patrol read cycle. In this case, the storage device 100 determines the reliability management operation condition of the first memory block BLK1 with reference to the health index table 122 and the LUT 123.

In operation S120, the storage device 100 determines whether the reliability management operation condition of the first memory block BLK1 is satisfied. When the reliability management operation condition of the first memory block BLK1 is satisfied, the storage device 100 performs operation S130.

In some implementations, as described above, when the reliability management operation condition means the patrol read cycle, the storage device 100 determines whether the patrol read cycle of the first memory block BLK1 passes. For example, the storage device 100 determines whether the patrol read cycle corresponding to the health index of the first memory block BLK1 passes. When the patrol read cycle of the first memory block BLK1 passes, the storage device 100 performs operation S130.

In operation S130, the storage device 100 performs the reliability management operation of the first memory block BLK1.

In some implementations, as described above, when the reliability management operation condition means the patrol read cycle, in operation S130, the storage device 100 may perform the patrol read operation on the first memory block BLK1.

For example, the storage device 100 may read data of preset memory cells among the memory cells included in the first memory block BLK1 and may measure an error rate. For example, the preset memory cells may refer to memory cells connected to at least one word line among a plurality of word lines that the first memory block BLK1 includes. Also, the storage device 100 may determine whether the measured error rate exceeds a reclaim threshold value. When the measured error rate exceeds the reclaim threshold value, the storage device 100 may designate the first memory block BLK1 as a read reclaim target block.

As described above, in some implementations, the storage device 100 may check the retention characteristics of memory blocks with reference to the health index table 122 and the LUT 123. Also, in consideration of the retention characteristics of the memory blocks, the storage device 100 may perform the reliability management operations optimized for each memory block.

In other words, the storage device 100 may individually manage the memory blocks based on the health indexes. As such, a point in time when the storage device 100 performs the reliability management operation may be optimized for each memory block. Accordingly, the storage device 100 may manage the reliability of data of memory blocks without an unnecessary operation.

In some implementations, operation S110 to operation S130 described above may be performed when the storage device 100 enters an idle mode. That is, when the storage device 100 operates in the idle mode, the storage device 100 may perform operation S110 to operation S130. The idle mode may refer to a mode in which the storage device 100 is in an available state but does not perform a work actually.

FIGS. 8 and 9 are example diagrams for describing operation S110 of FIG. 7. FIGS. 8 and 9 will be described with reference to FIGS. 1 to 7. FIG. 8 shows an example of the health index table 122, and FIG. 9 shows an example of the LUT 123. An example of the health index table 122 and an example of the LUT 123 are illustrated in FIGS. 8 and 9, but the present disclosure is not limited thereto. For example, the health index table 122 and the LUT 123 in some implementations may be changed or modified in various forms.

Referring to FIG. 8, the health index table 122 includes the health indexes respectively corresponding to the memory blocks BLK1 to BLKn of the nonvolatile memory device 110.

In some implementations, unlike the example illustrated in FIG. 8, the health index table 122 may include information about the reliability management operation condition corresponding to the health index, as well as the health indexes.

Referring to FIG. 9, the LUT 123 includes a plurality of reference values. The reference values may include cell counts corresponding to the health indexes and reliability management operation conditions (e.g., patrol read cycles) corresponding to the health indexes. In FIG. 9, the cell count may mean an on-cell count. However, the present disclosure is not limited thereto. The cell count may mean an off-cell count of a specific memory block, and the LUT 123 may include various information about the reliability management operation of the specific memory block. In some implementations, the LUT 123 may include information about a read reclaim operation condition corresponding to the health index. The cell count will be described in detail with reference to the following drawings.

For example, referring to the LUT 123 implemented as illustrated in FIG. 9, when the on-cell count of the memory block is 0 or more and less than 100, the health index of the memory block may be "A", and the patrol read cycle of the memory block may be "14 days". When the on-cell count of the memory block is 100 or more or less than 200, the health index of the memory block may be "B", and the patrol read cycle of the memory block may be "10 days". When the on-cell count of the memory block is 200 or more or less than 300 or when a measured on-cell count of the memory block is absent from the LUT 123, the health index of the memory block may be "C", and the patrol read cycle of the memory block may be "7 days". That is, a default value of the health index of the memory block may be "C". When the on-cell count of the memory block is 300 or more or less than 400, the health index of the memory block may be "D", and the patrol read cycle of the memory block may be "4 days". When the on-cell count of the memory block is 400 or more or less than 500, the health index of the memory block may be "E", and the patrol read cycle of the memory block may be "1 day". When the on-cell count of the memory block is 500 or more, the health index of the memory block may be "F", and the memory block may be treated as a runtime bad block (RTBB).

For example, the memory controller 120 may check the health indexes of the memory blocks BLK1 to BLKn with reference to the health index table 122. The memory controller 120 may determine the reliability management operation condition of each of the memory blocks BLK1 to BLKn, based on the checked health index and the LUT 123.

The health index table 122 and the LUT 123 may be implemented like the examples of FIGS. 8 and 9. In this case, the memory controller 120 may check that the health index of the first memory block BLK1 is "A", with reference to the health index table 122. Also, the memory controller 120 may determine that the patrol read cycle of the first memory block BLK1 is "14 days", with reference to the LUT 123. Accordingly, the memory controller 120 may perform the patrol read operation on the first memory block BLK1 every 14 days from a point in time when the storage device 100 is powered on. Also, the memory controller 120 may check that the health index of the second memory block BLK2 is "C", with reference to the health index table 122. The memory controller 120 may determine that the patrol read cycle of the second memory block BLK2 is "7 days", with reference to the LUT 123. Accordingly, the memory controller 120 may perform the patrol read operation on the second memory block BLK2 every 7 days from a point in time when the storage device 100 is powered on. Also, because the health index of the n-th memory block BLKn is "D", the memory controller 120 may perform the patrol read operation on the n-th memory block BLKn every 4 days from a point in time when the storage device 100 is powered on.

That is, the memory controller 120 may perform the reliability management operation in consideration of the retention characteristic of each of the memory blocks BLK1 to BLKn and may individually manage the reliability of data of the memory blocks BLK1 to BLKn without an unnecessary operation.

Figure 10:
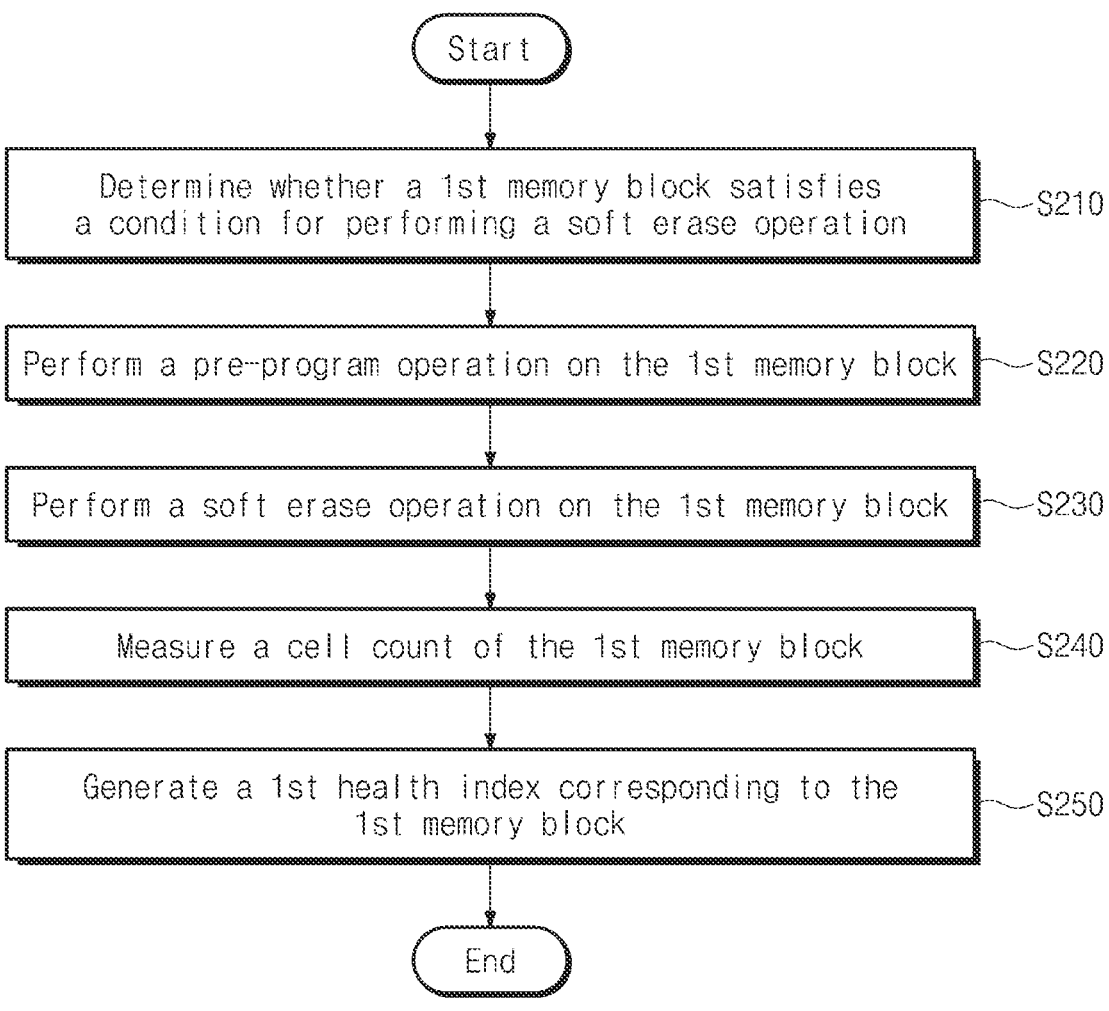
FIG. 10 is a flowchart illustrating an example of a health index generating method of a storage device of FIG. 1.

FIG. 10 is a flowchart illustrating an example of a health index generating method of a storage device of FIG. 1. FIG. 10 will be described with reference to FIGS. 1 to 9. In operation S210, the storage device 100 determines whether the first memory block BLK1 satisfies a soft erase operation condition. When the first memory block BLK1 satisfies the soft erase operation condition, the storage device 100 performs operation S220.

In some implementations, the first memory block BLK1 may be a free block. In this case, the first memory block BLK1 may satisfy the soft erase operation condition. As described above, the free block may mean a memory block including only invalid data.

For example, the first memory block BLK1 may be designated as a victim block for garbage collection. In this case, the storage device 100 may designate the first memory block BLK1 as a free block. Alternatively, the sudden power-off event may occur while the program operation is performed with respect to the memory cells of the first memory block BLK1. In this case, the storage device 100 may designate the first memory block BLK1 as a free block. The memory controller 120 may allow the first memory block BLK1 designated as the free block to store only invalid data. As such, the first memory block BLK1 may be set to the free block.

In some implementations, the first memory block BLK1 may be the free block, and the number of P/E cycles (or the P/E cycle count) of the first memory block BLK1 may be a reference value or more. In this case, the first memory block BLK1 may satisfy the soft erase operation condition.

In some implementations, the first memory block BLK1 may be the free block, the number of P/E cycles (or the P/E cycle count) of the first memory block BLK1 may be less than the reference value, and a first health index indicating a health index of the first memory block BLK1, which is included in the health index table 122, may be included in soft erase health indexes. In this case, the first memory block BLK1 may satisfy the soft erase operation condition.

For example, the health index table 122 may be implemented as illustrated in FIG. 8, and the LUT 123 may be implemented as illustrated in FIG. 9. Also, the soft erase health indexes may include "D", "E", and "F"; the first memory block BLK1, the second memory block BLK2, and the n-th memory block BLKn may be free blocks; the P/E cycle count of each of the first memory block BLK1, the second memory block BLK2, and the n-th memory block BLKn may be less than the reference value. In this case, the first memory block BLK1 and the second memory block BLK2 may be memory blocks that do not satisfy the soft erase operation condition, and the n-th memory block BLKn may be a memory block that satisfies the soft erase operation condition.

In operation S220, the storage device 100 performs the pre-program operation on the first memory block BLK1. The pre-program operation will be described with reference to FIG. 11.

In operation S230, the storage device 100 performs the soft erase operation on the first memory block BLK1. The soft erase operation may be one of operations of erasing data stored in a memory block. The soft erase operation will be described in detail with reference to the following drawings.

In operation S240, the storage device 100 measures a cell count of the first memory block BLK1. In some implementations, the cell count may be an on-cell count or an off-cell count calculated based on the soft erase reference voltage.

In operation S250, the storage device 100 generates the first health index corresponding to the first memory block BLK1. In detail, the storage device 100 may generate the first health index with reference to the cell count and the LUT 123. The first health index may be associated with the retention characteristic of the first memory block BLK1.

For example, the cell count may refer to the on-cell count, and the LUT 123 may be implemented like the example illustrated in FIG. 9. Also, the cell count may be 120. In this case, the first health index thus generated may be "B".

In some implementations, operation S210 to operation S250 described above may be performed when the storage device 100 enters the idle mode. That is, when the storage device 100 operates in the idle mode, the storage device 100 may perform operation S210 to operation S250.

In some implementations, the storage device 100 may perform the soft erase operation only when a memory block is a free block. That is, the storage device 100 may check a retention characteristic of a memory block in which valid data are not stored, by performing the soft erase operation on the memory block, then measuring the cell count, and then generating the health index. As such, the storage device 100 may check the retention characteristic of the memory block without the loss of valid data.

Figure 11:
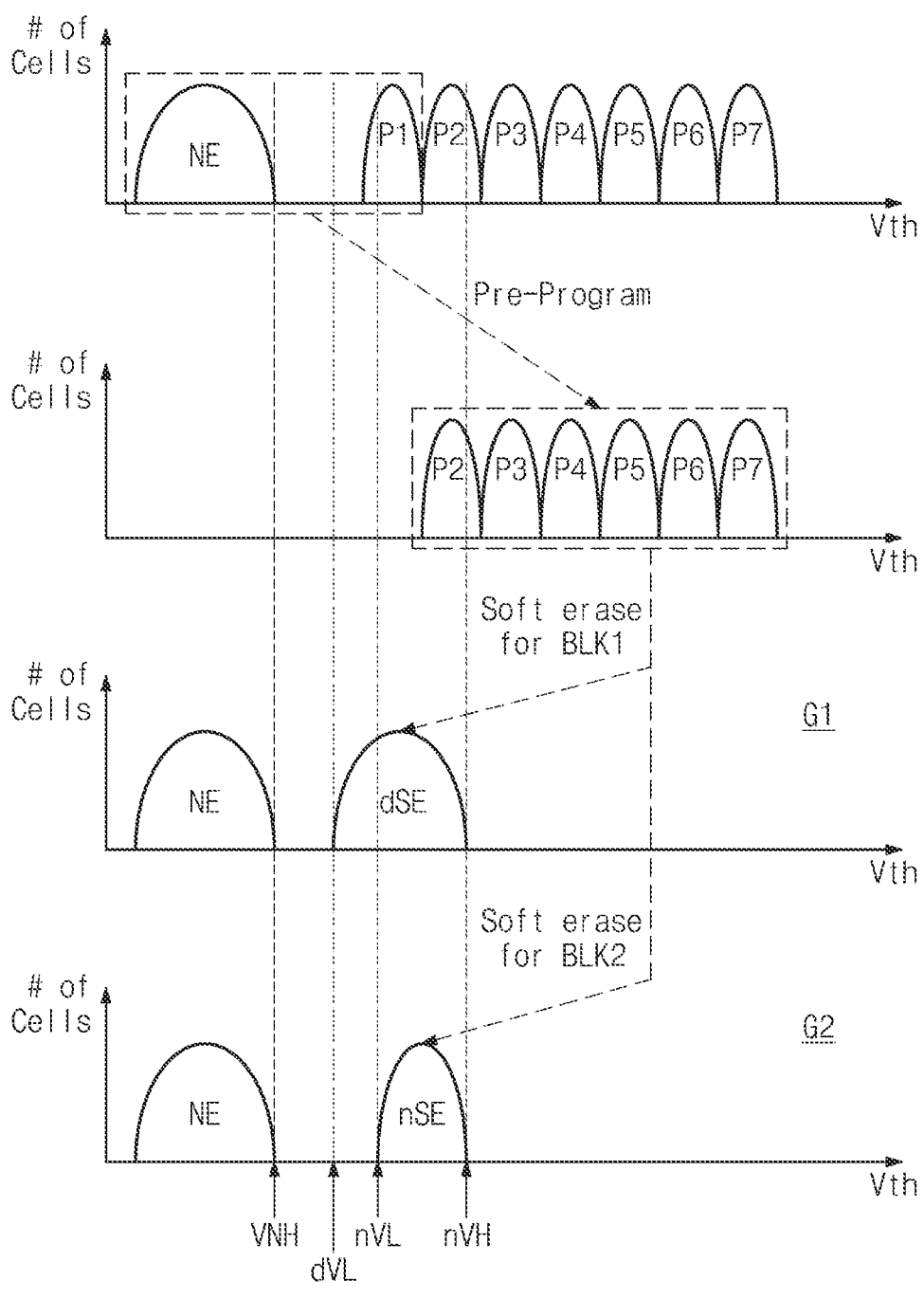
FIG. 11 is a diagram for describing an example of a pre-program operation and a soft erase operation of FIG. 10.

FIG. 11 is a diagram for describing an example of a pre-program operation and a soft erase operation of FIG. 10. FIG. 11 will be described with reference to FIG. 10. In distribution diagrams of FIG. 11, a horizontal axis represents a threshold voltage of a memory cell, and a vertical axis represents the number of memory cells. In FIG. 11, a first distribution diagram G1 shows threshold voltage distributions of the memory cells of the first memory block BLK1 after the pre-program operation and the soft erase operation are performed with respect to the first memory block BLK1. A second distribution diagram G2 shows threshold voltage distributions of the memory cells of the second memory block BLK2 after the pre-program operation and the soft erase operation are performed with respect to the second memory block BLK2.

For example, the first memory block BLK1 may be a defective memory block degraded due to a process defect or a plurality of operations (e.g., read, write, and erase operations). In contrast, the second memory block BLK2 may be a normal memory block that does not include a defect and is not degraded. In this case, the second memory block BLK2 may be referred to as having a normal retention characteristic.

In this case, immediately after the soft erase operation is performed with respect to the first and second memory blocks BLK1 and BLK2 that experience the pre-program operation, the memory cells of the first memory block BLK1 may have a defective soft erase state dSE, and the memory cells of the second memory block BLK2 may have a normal soft erase state nSE.

For example, a lower limit value nVL of the threshold voltage distribution of the normal soft erase state nSE may be higher than an upper limit value VNH of the threshold voltage distribution of the normal erase state NE. For example, the lower limit value nVL of the threshold voltage distribution of the normal soft erase state nSE may be higher than a lower limit value of the threshold voltage distribution of the first program state P1. Also, an upper limit value nVH of the threshold voltage distribution of the normal soft erase state nSE may be lower than a lower limit value of the threshold voltage distribution of the third program state P3. However, the present disclosure is not limited thereto. For example, the lower limit value nVL of the threshold voltage distribution of the normal soft erase state nSE may mean an arbitrary state in which the lower limit value nVL of the threshold voltage distribution is higher than the upper limit value VNH of the threshold voltage distribution of the normal erase state NE.

Referring to FIGS. 10 and 11, the memory controller 120 may perform the pre-program operation before performing the soft erase operation. In some implementations, the pre-program operation may mean an operation of controlling threshold voltages of memory cells having a program state lower than the normal soft erase state nSE from among memory cells of a memory block. Through the pre-program operation, the memory cells having a program state lower than the normal soft erase state nSE may be programmed to have a program state higher than the normal soft erase state nSE.

For example, a lower limit value of a threshold voltage distribution of a program state that a memory cell has may be lower than the lower limit value nVL of the threshold voltage distribution of the normal soft erase state nSE. In this case, the memory cell may be referred to as having a program state lower than the normal soft erase state nSE. In the example of FIG. 11, memory cells having the normal erase state NE or the first program state P1 may be referred to as having a program state lower than the normal soft erase state nSE, and memory cells having the second program state P2 to the seventh program state P7 may be referred to as having a program state higher than the normal soft erase state nSE.

After the pre-program operation is performed, the memory controller 120 may perform the soft erase operation. The soft erase operation may be one of operations of discharging charges stored in a memory block such that data are erased. Unlike the normal erase operation, the soft erase operation may refer to an operation of discharging only some of charges stored in memory cells of a memory block.

In detail, when the memory controller 120 performs the soft erase operation on a memory block, like the normal erase operation, an erase voltage being a high voltage may be applied to the body of memory cells of the memory block. However, the soft erase voltage may be applied to word lines to which the memory cells are connected. In some implementations, the soft erase voltage may be 3 V, and a voltage applied to word lines connected to memory cells in the normal erase operation may be 0 V. Accordingly, when the soft erase operation is performed with respect to the memory block, the charges stored in the memory block may be discharged less than when the normal erase operation is performed. In other words, unlike the case where the normal erase operation is performed, some charges may remain at the memory cells of the memory block where the soft erase operation is performed.

As described above, the first memory block BLK1 may be a defective memory block, and the second memory block BLK2 may be a normal memory block. In this case, the charge loss may occur more easily in the first memory block BLK1 than in the second memory block BLK2. That is, the charges stored in the first memory block BLK1 may be discharged more easily than the charges stored in the second memory block BLK2. In other words, the retention characteristic of the second memory block BLK2 may be better than the retention characteristic of the first memory block BLK1.

As described above, some of the charges stored in the memory block may remain even after the soft erase operation is performed. When the soft erase operation is performed, the same soft erase voltage may be applied to the word lines of the first memory block BLK1 and the word lines of the second memory block BLK2. However, due to a retention characteristic difference of the first memory block BLK1 and the second memory block BLK2, the charges stored in the first memory block BLK1 may be discharged more easily than the charges stored in the second memory block BLK2. Accordingly, while the soft erase operation is performed, the amount of charges discharged from the memory cells of the first memory block BLK1 may be larger than that of the second memory block BLK2.

As such, after the soft erase operation is performed, the memory cells of the first memory block BLK1 being a defective memory block may have the defective soft erase state dSE, and the memory cells of the second memory block BLK2 being a normal memory block may have the normal soft erase state nSE. In this case, the lower limit value dVL of the threshold voltage distribution of the defective soft erase state dSE may be lower than the lower limit value nVL of the threshold voltage distribution of the normal soft erase state nSE.

In some implementations, the memory controller 120 may check the retention characteristic of each memory block, based on a difference between a lower limit value (e.g., nVL) of the threshold voltage distribution of the normal soft erase state nSE and a lower limit value (e.g., dVL) of the threshold voltage distribution of the defective soft erase state dSE. Also, the memory controller 120 may determine whether the memory block is a defective memory block, based on the above lower limit value difference of the threshold voltage distributions. Below, how to check a retention characteristic will be described in detail.

In other words, in some implementations, as not the normal erase operation but the soft erase operation is used, immediately after the soft erase operation is performed, it may be possible to check a threshold voltage distribution difference of the normal memory block and the defective memory block.

Meanwhile, in some implementations, unlike the above description, the pre-program operation may mean an operation of controlling threshold voltages of specific memory cells having a program state lower than the normal soft erase state nSE from among memory cells of a memory block. For example, specific memory cells may be memory cells connected to word lines determined in advance. For example, the word lines determined in advance may mean word lines sensitive to degradation. For example, the number of word lines determined in advance may be one or more. Through the pre-program operation, the specific memory cells may be programmed to have a program state higher than the normal soft erase state nSE. For example, after the pre-program operation is performed with respect to the first memory block BLK1 and the second memory block BLK2, the memory controller 120 may perform the soft erase operation. In this case, after the soft erase operation is performed, first memory cells connected to the word lines determined in advance from among the memory cells of the first memory block BLK1 may have the normal soft erase state nSE. In contrast, memory cells connected to the word lines determined in advance from among the memory cells of the second memory block BLK2 may have the defective soft erase state dSE.

For convenience, below, the description will be given based on the case where the pre-program operation is an operation of controlling threshold voltages of all memory cells having a program state lower than the normal soft erase state nSE from among memory cells of a memory block.

Figure 12:
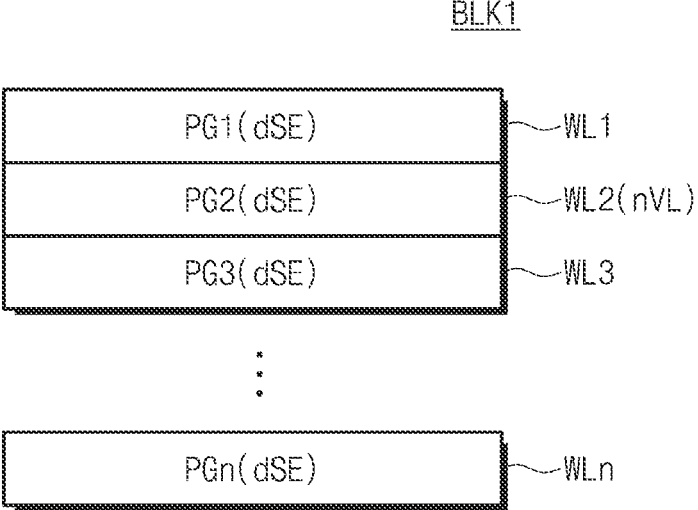
FIG. 12 is a diagram for describing operation S240 of FIG. 10.

FIG. 12 is an example diagram for describing operation S240 of FIG. 10. FIG. 12 will be described with reference to FIGS. 1 to 11. Referring to FIG. 12, the first memory block BLK1 includes a plurality of pages PG1 to PGn. The plurality of pages PG1 to PGn are connected to word lines WL1 to WLn. Each of the plurality of pages PG1 to PGn includes a plurality of memory cells. For example, memory cells that the first page PG1 includes are connected to the first word line WL1, memory cells that the second page PG2 includes are connected to the second word line WL2, memory cells that the third page PG3 includes are connected to the third word line WL3, and memory cells that the n-th page PGn includes are connected to the n-th word line WLn.

For example, as described with reference to FIG. 11, the first memory block BLK1 may be a defective memory block. As such, after the soft erase operation is performed with respect to the first memory block BLK1, the memory cells of the pages PG1 to PGn may have the defective soft erase state dSE. The memory controller 120 may measure a cell count by applying the soft erase reference voltage to a specific word line (e.g., WL2) determined in advance from among the word lines WL1 to WLn.

In some implementations, the specific word line (e.g., WL2) may be a word line connected to memory cells experiencing the pre-program operation.

For example, the cell count may be an on-cell count or an off-cell count. For example, the memory controller 120 may once perform the read operation with respect to first memory cells (e.g., first memory cells connected to the second word line WL2) determined in advance by using the soft erase reference voltage. The soft erase reference voltage refers to a read voltage for performing an on-cell/off-cell counting operation. The memory controller 120 may detect the number of memory cells (i.e., on-cells) whose threshold voltages are lower than the soft erase reference voltage. Alternatively, the memory controller 120 may detect the number of memory cells (i.e., off-cells) whose threshold voltages are higher than the soft erase reference voltage. For example, as the on-cell count increases, the charge loss may become greater. Likewise, as the off-cell count decreases, the charge loss may become greater.

For example, the soft erase reference voltage may be a lower limit value (e.g., nVL of FIG. 11) of a threshold voltage distribution of a normal soft erase state (e.g., nSE of FIG. 11).

For example, because the program operation is for storing charges in a memory cell, the defective memory block and the normal memory block may have the same threshold voltage distribution immediately after the program operation is performed. Accordingly, only when a separate retention time passes after the program operation is performed, the memory controller 120 may determine whether a memory block is a defective memory block. Meanwhile, because the soft erase operation is for discharging charges present in a memory cell, as illustrated in FIG. 11, the threshold voltage distributions of the defective memory block and the normal memory block may be different from each other immediately after the soft erase operation is performed. In some implementations, the memory controller 120 may check a retention characteristic of a memory block by measuring a cell count without waiting for the separate retention time after the soft erase operation is performed.

FIG. 13 is an example flowchart illustrating operation S250 of FIG. 10 in detail. Referring to FIG. 13, in operation S251, the storage device 100 compares a cell count and the LUT 123. In detail, the storage device 100 generates a first health index corresponding to the cell count based on the reference values of the LUT 123. For example, the cell count means the on-cell count, and the cell count is 120. Also, the LUT 123 is implemented as illustrated in FIG. 9. In this case, the first health index generated by the storage device 100 is "B".

In operation S252, the storage device 100 compares the first health index and a first reference health index. For example, the health index table 122 includes health indexes generated in the past. The health indexes generated in the past are referred to as "reference health indexes". The first reference health index is a reference health index corresponding to the first memory block BLK1 from among the reference health indexes. That is, the first reference health index means the past health index corresponding to the first memory block BLK1.

When the first reference health index is the same as the first health index, the storage device 100 performs operation S253. In operation S253, the storage device 100 maintains the health index table 122.

When the first reference health index is different from the first health index, the storage device 100 performs operation S254. In operation S254, the storage device 100 updates the health index table 122. In detail, the storage device 100 changes the first reference health index of the health index table 122 to the first health index.

In some implementations, the storage device 100 may compare a current health index value and a past health index value for each memory block. When the current health index value and the past health index value are different, the storage device 100 may update the health index table 122. As such, the storage device 100 may check retention characteristics of memory blocks, which vary over time, and may manage the memory blocks based on the retention characteristics.

Figure 14:
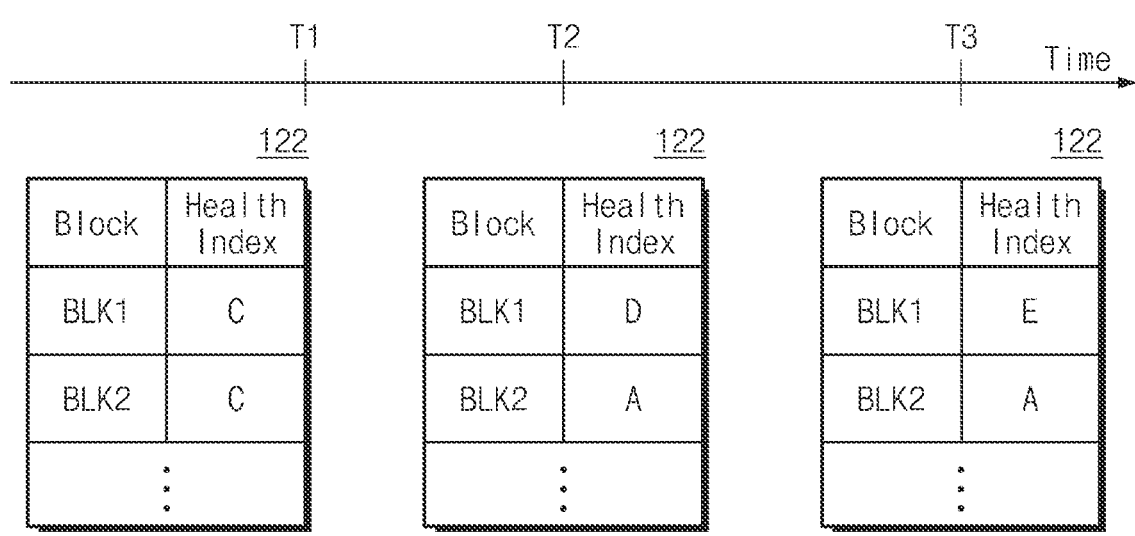
FIG. 14 is a diagram for describing operation S250 of FIG. 10.

FIG. 14 is an example diagram for describing operation S250 of FIG. 10. In detail, an example of an operation in which the memory controller 120 manages the health index table 122 is illustrated in FIG. 14. FIG. 14 will be described with reference to FIGS. 1 to 13. FIG. 14 will be described based on the case where the memory controller 120 generates a health index of each memory block based on an on-cell count. However, the present disclosure is not limited thereto.

Referring to FIG. 14, at a first point in time T1, the first memory block BLK1 and the second memory block BLK2 may be memory blocks in which data are not stored. Also, before the first point in time T1, the soft erase operation may not be performed with respect to the first memory block BLK1 and the second memory block BLK2. In this case, health indexes of the first and second memory blocks BLK1 and BLK2, which are included in the health index table 122, may be of a default value of "C".

For example, in the time period from T1 to T2, the memory controller 120 may designate the first memory block BLK1 as a free block. As such, the first memory block BLK1 may be set to the free block. In this case, the memory controller 120 may determine that the first memory block BLK1 satisfies the soft erase operation condition, may perform the pre-program operation on the first memory block BLK1, may perform the soft erase operation on the first memory block BLK1, and may measure a first on-cell count of the first memory block BLK1. In some implementations, the first on-cell count may be 300 or more and less than 400.

For example, in the time period from T1 to T2, the memory controller 120 may generate the first health index based on the first on-cell count and the LUT 123. The first health index thus generated may be "D". The memory controller 120 may compare the first health index and the first reference health index. The first reference health index may be a health index (e.g., "C") that is included in the health index table 122 after generated before the first health index (e.g., "D") is generated and corresponds to the first memory block BLK1. Because the first reference health index of "C" and the first health index of "D" are different, the memory controller 120 may update the health index table 122. As such, at the second point in time T2, the health index of the first memory block BLK1 included in the health index table 122 may be set to "D".

Meanwhile, for example, in the time period from T1 to T2, the memory controller 120 may designate the second memory block BLK2 as a free block. As such, the second memory block BLK2 may be set to the free block. The memory controller 120 may determine that the second memory block BLK2 satisfies the soft erase operation condition, may perform the pre-program operation on the second memory block BLK2, may perform the soft erase operation on the second memory block BLK2, and may measure a second on-cell count of the second memory block BLK2. In some implementations, the second on-cell count may be 0 or more and less than 100.

For example, in the time period from T1 to T2, the memory controller 120 may generate a second health index based on the second on-cell count and the LUT 123. The second health index thus generated may be "A". The memory controller 120 may compare the second health index and the second reference health index. The second reference health may be a health index (e.g., "C") that is included in the health index table 122 after generated before the second health index (e.g., "A") is generated and corresponds to the second memory block BLK2. Because the second reference health index of "C" and the second health index of "A" are different, the memory controller 120 may update the health index table 122. As such, at the second point in time T2, the health index of the second memory block BLK2 included in the health index table 122 may be set to "A".

In the time period from T2 to T3, the memory controller 120 may again designate the first memory block BLK1 as a free block. As such, the memory controller 120 may determine that the first memory block BLK1 satisfies the soft erase operation condition, may perform the pre-program operation on the first memory block BLK1, may perform the soft erase operation on the first memory block BLK1, and may again measure the first on-cell count of the first memory block BLK1. In some implementations, the first on-cell count may be 400 or more and less than 500.

In the time period from T2 to T3, the memory controller 120 may again generate the first health index based on the first on-cell count and the LUT 123. The first health index thus generated may be "E". The memory controller 120 may compare the first health index and the first reference health index. The first reference health may be a health index (e.g., "D") that is included in the health index table 122 after generated before the first health index (e.g., "E") is generated and corresponds to the first memory block BLK1. Because the first reference health index of "D" and the first health index of "E" are different, the memory controller 120 may update the health index table 122. As such, after the third point in time T3, the health index of the first memory block BLK1 may be set to "E".

Also, in the time period from T2 to T3, the memory controller 120 may again designate the second memory block BLK2 as a free block. The memory controller 120 may determine that the second memory block BLK2 satisfies the soft erase operation condition, may perform the pre-program operation on the second memory block BLK2, may perform the soft erase operation on the second memory block BLK2, and may again measure the second on-cell count of the second memory block BLK2. In some implementations, the second on-cell count may be 0 or more and less than 100. The memory controller 120 may again generate the second health index based on the second on-cell count and the LUT 123. The second health index thus generated may be "A".

In the time period from T2 to T3, the memory controller 120 may compare the second reference health index and the second health index. The second reference health may be a health index (e.g., "A") that is included in the health index table 122 after generated before the second health index (e.g., "A") is generated and corresponds to the second memory block BLK2. Because the second reference health index of "A" is the same as the second health index of "A", the memory controller 120 may maintain the health index table 122. As such, after the third point in time T3, the health index of the second memory block BLK2 may still be "A".

As described above, the memory controller 120 in some implementations may generate a health index by measuring a cell count after performing the pre-program operation and the soft erase operation with respect to a memory block satisfying the soft erase operation condition. A memory block that is designated as a free block may be continuously changed while the memory controller 120 operates. As such, the memory controller 120 may generate health indexes respectively corresponding to memory blocks. The memory controller 120 may individually manage the memory blocks based on the health index table 122 and the LUT 123. For example, the memory controller 120 may perform the patrol read operation for each memory block based on the health index table 122 and the LUT 123, every optimal period.

Figure 15:
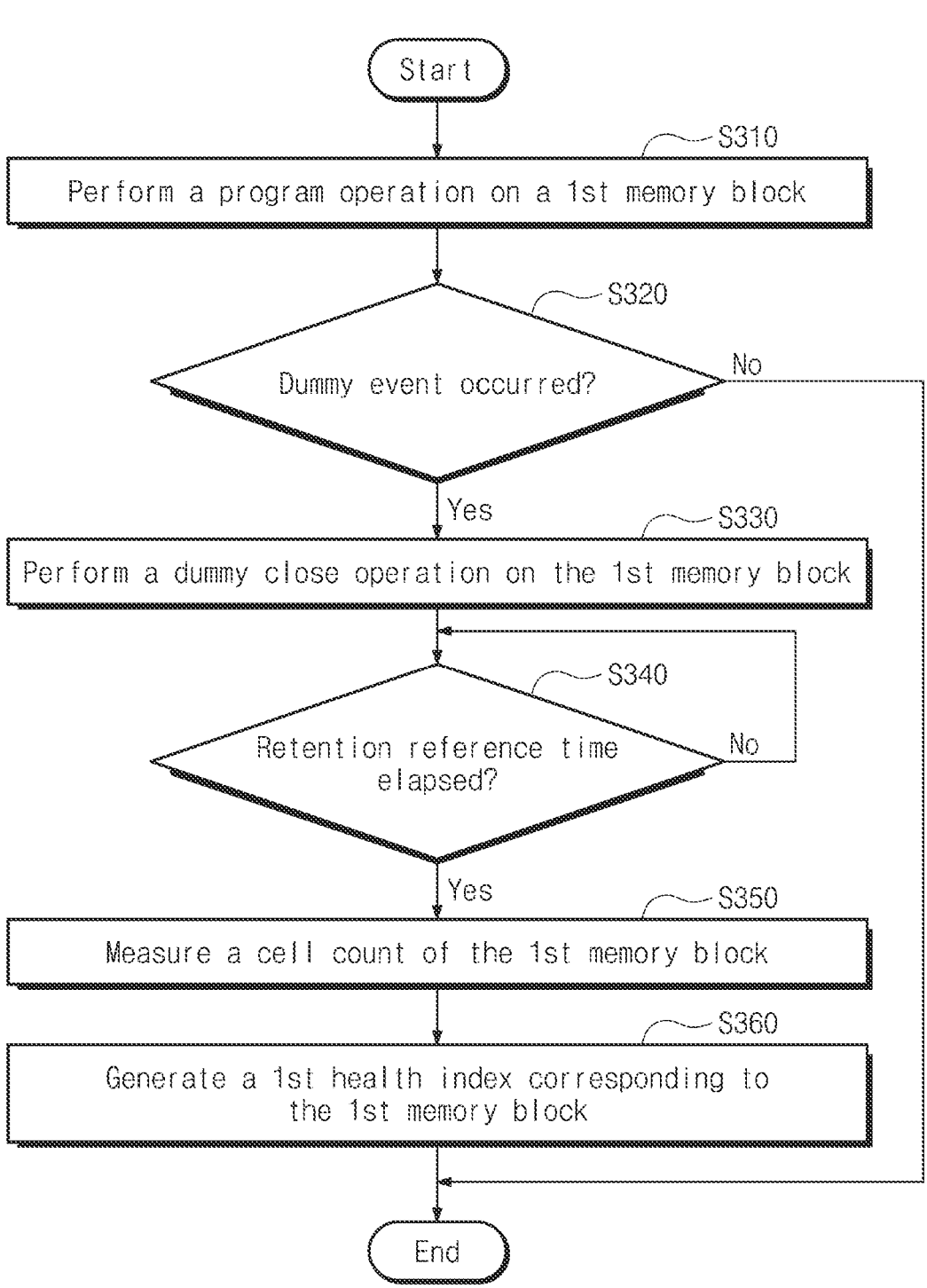
FIG. 15 is a flowchart illustrating another example a health index generating method of a storage device of FIG. 1.

FIG. 15 is a flowchart illustrating another example a health index generating method of a storage device of FIG. 1. FIG. 15 will be described with reference to FIGS. 1 to 14. In operation S310, the storage device 100 performs the program operation on the first memory block BLK1. The program operation is performed with respect to at least one of pages included in the first memory block BLK1.

In operation S320, the storage device 100 determines whether a dummy event occurs. The dummy event may include 1) the sudden power-off event and 2) the event that an idle reference time of the first memory block BLK1 including at least one page not programmed passes from a point in time when operation S310 ends. When the dummy event occurs, the storage device 100 performs operation S330.

In operation S330, the storage device 100 performs the dummy close operation on the first memory block BLK1. In detail, the storage device 100 programs dummy data at pages not programmed from among the pages of the first memory block BLK1.

In operation S340, the storage device 100 determines whether a retention reference time passes. When the retention reference time passes from a point in time when the dummy close operation is performed, the storage device 100 performs operation S350.

In operation S350, the storage device 100 measures a cell count of the first memory block BLK1. The cell count is an on-cell count or off-cell count that is based on a dummy close reference voltage.

In operation S360, the storage device 100 generates a first health index corresponding to the first memory block BLK1.

In some implementations, operation S320 to operation S360 are performed when the storage device 100 enters the idle mode.

Figure 16:
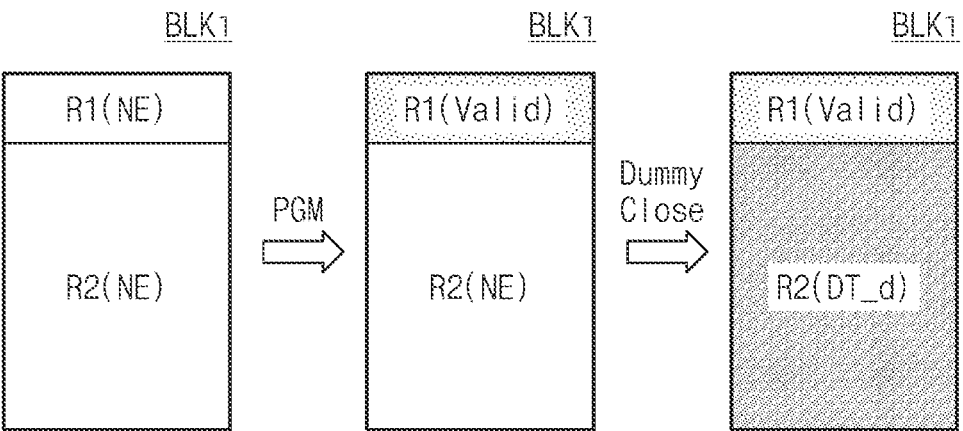
FIG. 16 is a diagram for describing an example dummy close operation of FIG. 15.

FIG. 16 is a diagram for describing an example dummy close operation of FIG. 15. Referring to FIG. 16, the first memory block BLK1 includes a first storage region R1 and a second storage region R2. The first storage region R1 and the second storage region R2 include a plurality of memory cells.

For example, at a first point in time, the memory controller 120 may perform the normal erase operation on the first memory block BLK1. In this case, the memory cells of the first storage region R1 and the second storage region R2 may have the normal erase state NE. Afterwards, the memory controller 120 may perform the program operation on the first storage region R1. For example, at a second point in time, the program operation of the first storage region R1 may end. In this case, each memory cell of the first storage region R1 may have one of the first to seventh program states P1 to P7. That is, valid data may be stored in the first storage region R1.

For example, until the idle reference time passes from the second point in time, the additional program operation may not be performed with respect to the memory cells of the second storage region R2. In this case, the memory controller 120 may determine that the dummy event occurs. As such, the memory controller 120 may perform the dummy close operation on the first memory block BLK1. That is, the memory controller 120 may program dummy data DT_d at the memory cells of the second storage region R2.

For example, the sudden power-off event may occur while the program operation of the first storage region R1 is performed. In this case, the memory controller 120 may determine that the dummy event occurs. As such, the memory controller 120 may perform the dummy close operation on the first memory block BLK1. That is, the memory controller 120 may program the dummy data DT_d at the memory cells of the second storage region R2.

For example, a memory cell included in a storage region (e.g., the first storage region R1) in which valid data are stored may be referred to as a "data memory cell", and a memory cell of a storage region (e.g., the second storage region R2) in which data are not programmed until the idle reference time passes from a point in time when the erase operation or the soft erase operation is performed may be referred to as an "open memory cell".

For example, when the second storage region R2 is left alone without the execution of the program operation, threshold voltage distribution of the memory cells of the second storage region R2 may increase due to the disturb. When the threshold voltage distribution of the memory cells excessively increases, the threshold voltage distribution of the memory cells with the erase state may overlap the first program state P1. In this case, the read error may occur in the first memory block BLK1.

To prevent the above issue due to memory cells not programmed, the memory controller 120 may perform the dummy close operation.

Figure 17:
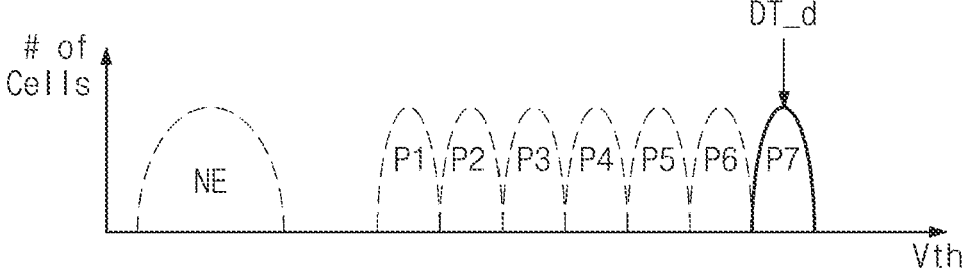
FIG. 17 is a distribution diagram illustrating an example of dummy data of FIG. 16.

FIG. 17 is a distribution diagram illustrating an example of dummy data of FIG. 16. When the dummy event occurs in a memory block, the storage device 100 programs the dummy data DT_d at open memory cells (e.g., the memory cells of the second storage region R2 of FIG. 2) of the memory block.

For example, the dummy data DT_d may mean the uppermost program state among a plurality of program states (in other words, a program state corresponding to the highest threshold voltage distribution). For example, in FIG. 16, the memory cells of the second storage region R2 may be programmed to the seventh program state P7 through the dummy close operation.

As described above, as a threshold voltage distribution corresponding to a program state of a memory cell becomes higher, the charge loss of the memory cell may become faster. In some implementations, the memory controller 120 may perform the dummy close operation based on the uppermost program state among the plurality of program states. In this case, the charge loss of memory cells experiencing the dummy close operation may become faster. The memory controller 120 may generate a health index of a memory block based on the change in the threshold voltage distribution of the memory cells where the dummy close operation is performed.

Figure 18:
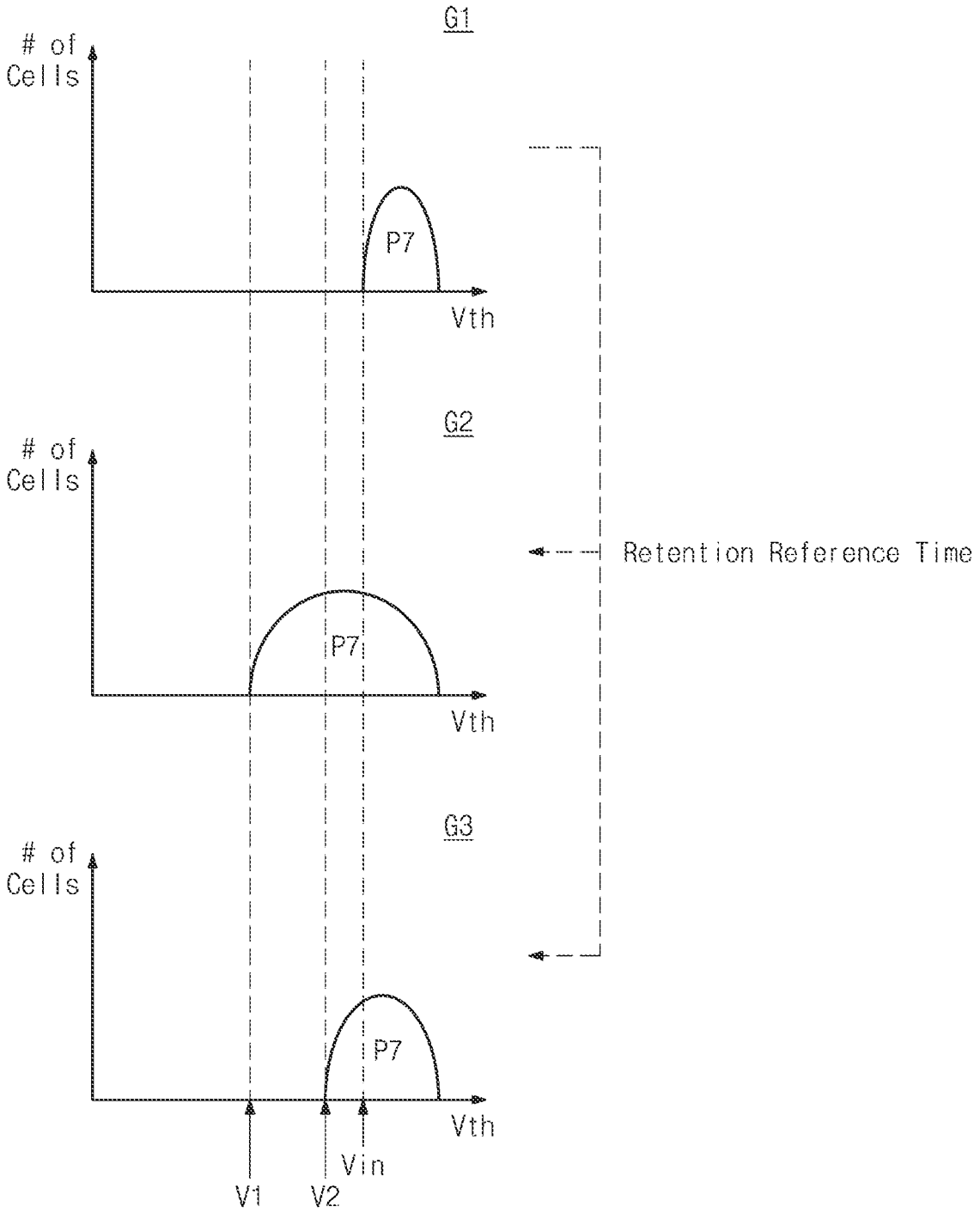
FIG. 18 is a diagram illustrating an example of a threshold voltage distribution change for each memory block where a dummy close operation is performed.

FIG. 18 is a diagram illustrating an example of a threshold voltage distribution change for each memory block where a dummy close operation is performed. In FIG. 18, a horizontal axis represents a threshold voltage of a memory cell, and a vertical axis represents the number of memory cells.

For example, the dummy close operation is performed with respect to the first memory block BLK1 and the second memory block BLK2. For example, at a first point in time, the dummy close operation of the first memory block BLK1 and the second memory block BLK2 ends. In this case, at the first point in time, the threshold voltage distribution of the memory cells experiencing the dummy close operation is formed as shown in a first distribution diagram G1. That is, at the first point in time, a lower limit value of the threshold voltage distribution of the memory cells experiencing the dummy close operation corresponds to an initial value Vin.

As already described above, the retention characteristic of the first memory block BLK1 and the retention characteristic of the second memory block BLK2 may be different from each other. For example, the retention characteristic of the second memory block BLK2 may be better than the retention characteristic of the first memory block BLK1. In this case, after the retention reference time passes from the first point in time, the threshold voltage distribution of the memory cells of the first memory block BLK1 where the dummy close operation is performed may be formed as shown in a second distribution diagram G2. Also, after the retention reference time passes from the first point in time, the threshold voltage distribution of the memory cells of the second memory block BLK2 where the dummy close operation is performed may be formed as shown in a third distribution diagram G3.

That is, a lower limit value of the threshold voltage distribution of the memory cells included in the first memory block BLK1 may correspond to a first voltage V1, and a lower limit value of the threshold voltage distribution of the memory cells included in the second memory block BLK2 may correspond to a second voltage V2. In this case, a difference "Vin−V1" between the initial voltage Vin and the first voltage V1 may be greater than a difference "Vin−V2" between the initial voltage Vin and the second voltage V2. That is, during the same time, the amount of charge loss that occurs in the first memory block BLK1 may be greater than the amount of charge loss that occurs in the second memory block BLK2.

The memory controller 120 may check a retention characteristic of a memory block based on how much a lower limit value of a threshold voltage distribution of memory cells experiencing the dummy close operation decreases while the retention reference time passes.

In some implementations, the memory controller 120 may accelerate the charge loss of the memory cells by programming the memory cells to the uppermost program state (e.g., P7) in the dummy close operation. As the charge loss of the memory cells experiencing the dummy close operation is accelerated, the retention reference time may be minimized.

Figure 19:
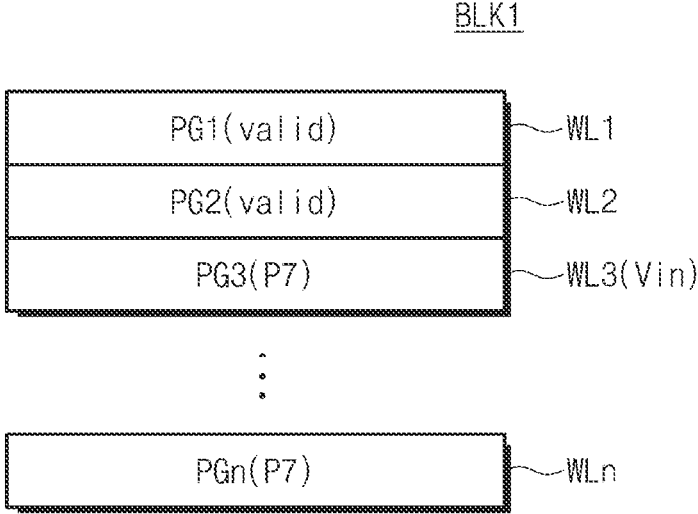
FIG. 19 is a diagram for describing operation S350 of FIG. 15.

FIG. 19 is an example diagram for describing operation S350 of FIG. 15. In detail, FIG. 19 is a diagram for describing a method of measuring a cell count of the first memory block BLK1 after the retention reference time passes from a point in time when the dummy close operation is performed. Referring to FIG. 19, the first memory block BLK1 includes the plurality of pages PG1 to PGn connected to the word lines WL1 to WLn. For example, the dummy close operation is performed after valid data are programmed at memory cells of the first and second pages PG1 and PG2. As the dummy close operation is performed, memory cells of the third to n-th pages PG3 to PGn have the uppermost program state P7.

For example, after the retention reference time passes from a point in time when the dummy close operation is performed, the memory controller 120 may measure a cell count by applying the dummy close reference voltage to a specific word line (e.g., WL3) determined in advance from among the word lines WL3 to WLn connected to the pages PG3 to PGn where the dummy data are programmed.

For example, the cell count may be an on-cell count or an off-cell count. For example, the memory controller 120 may once perform the read operation with respect to specific memory cells determined in advance by using the dummy close reference voltage. The dummy close reference voltage refers to a read voltage for performing an on-cell/off-cell counting operation. The memory controller 120 may detect the number of memory cells (i.e., on-cells) whose threshold voltages are lower than the dummy close reference voltage. Alternatively, the memory controller 120 may detect the number of memory cells (i.e., off-cells) whose threshold voltages are higher than the dummy close reference voltage. For example, as the on-cell count increases, the charge loss may become greater. Likewise, as the off-cell count decreases, the charge loss may become greater.

For example, the dummy close reference voltage may correspond to a lower limit value (e.g., the initial voltage Vin of FIG. 18) of the threshold voltage distribution of the memory cells in which the dummy data are programmed, immediately after the dummy close operation is performed.

Figure 20:
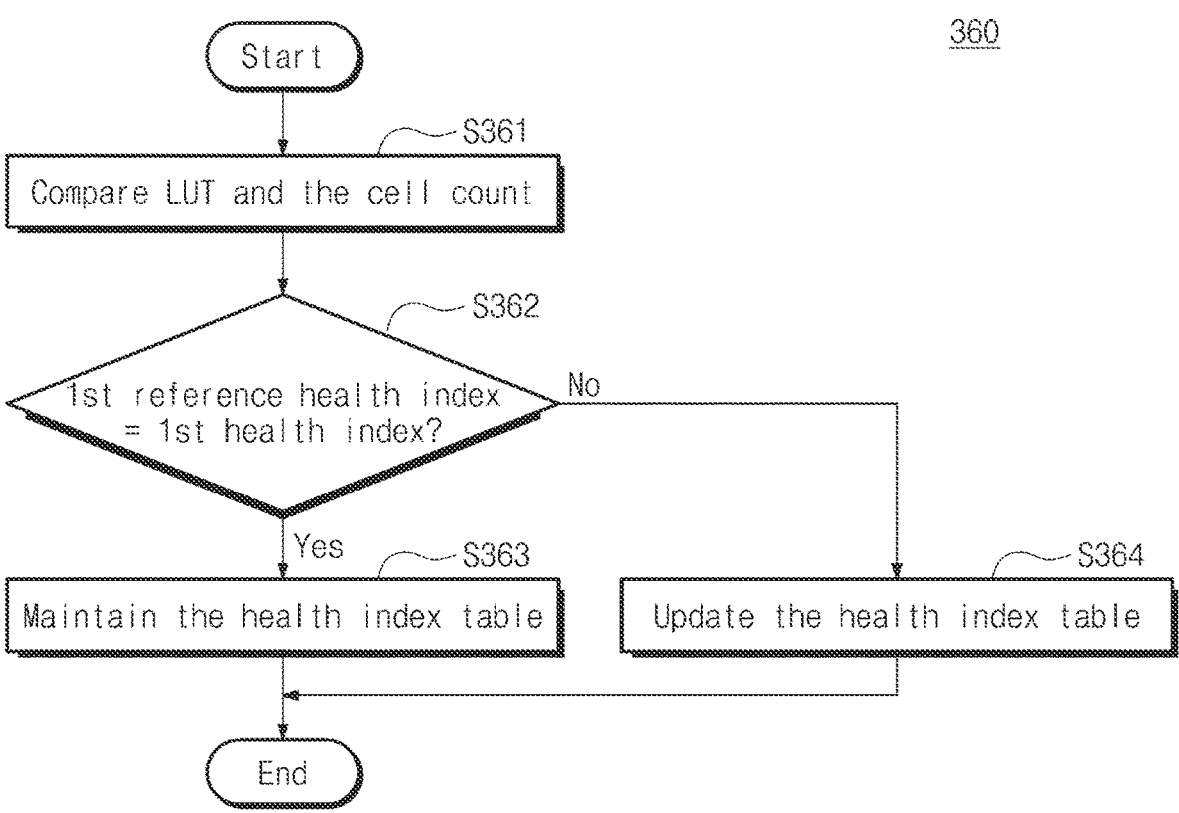
FIG. 20 is a flowchart illustrating operation S360 of FIG. 15 in detail.

FIG. 20 is an example flowchart illustrating operation S360 of FIG. 15 in detail. Referring to FIG. 20, in operation S361, the storage device 100 compares a cell count and the LUT 123. In detail, the storage device 100 generates a first health index corresponding to the cell count based on the reference values of the LUT 123. For example, the cell count means the on-cell count, and the cell count is 50. Also, the LUT 123 is implemented as illustrated in FIG. 9. In this case, the first health index generated by the storage device 100 is "A".

In operation S362, the storage device 100 compares the first health index and a first reference health index. For example, the health index table 122 may include health indexes generated in the past. The health indexes generated in the past may be referred to as "reference health indexes". The first reference health index may be a reference health index corresponding to the first memory block BLK1 from among the reference health indexes. That is, the first reference health index may mean the past health index corresponding to the first memory block BLK1.

When the first reference health index is the same as the first health index, the storage device 100 performs operation S363. In operation S363, the storage device 100 maintains the health index table 122.

When the first reference health index is different from the first health index, the storage device 100 performs operation S364. In operation S364, the storage device 100 updates the health index table 122. In detail, the storage device 100 changes the first reference health index of the health index table 122 to the first health index.

In some implementations, the storage device 100 may compare a current health index value and a past health index value for each memory block. When the current health index value and the past health index value are different, the storage device 100 may update the health index table 122.

Figure 21:
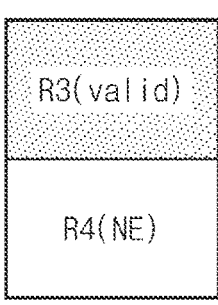
FIG. 21 is a diagram for describing an example of a health index generating method according to an implementation of the present disclosure.
Figure 21:
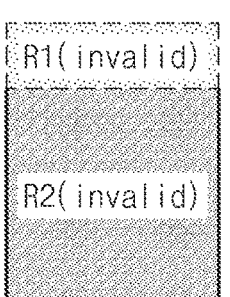
Figure 21:
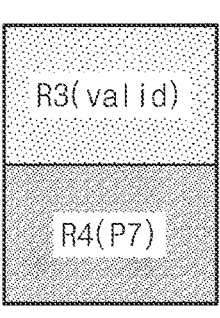
Figure 21:
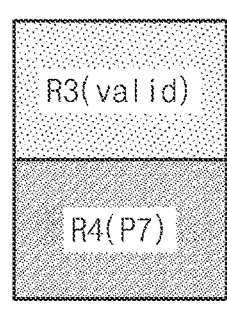
Figure 21:
Figure 21:
Figure 21:

FIG. 21 is a diagram for describing an example of a health index generating method according to an implementation of the present disclosure. FIG. 21 will be described with reference to FIGS. 1 to 20. Referring to FIG. 21, the nonvolatile memory device 110 includes the first memory block BLK1 and the second memory block BLK2. The first memory block BLK1 includes the first storage region R1 and the second storage region R2, and the second memory block BLK2 includes a third storage region R3 and a fourth storage region R4.

For example, before a first point in time, the normal erase operation may be performed with respect to the first and second memory blocks BLK1 and BLK2. In this case, after the first point in time, the memory cells of the first memory block BLK1 and the second memory block BLK2 may have the normal erase state NE. That is, the first and second memory blocks BLK1 and BLK2 may be in a state where data are not stored and new data are capable of being written. Also, a health index of each of the first and second memory blocks BLK1 and BLK2 may be set to a default value (e.g., "C"). In other words, the health index table 122 may include information indicating the health index of the first memory block BLK1 is "C" and the health index of the second memory block BLK2 is "C".

Afterwards, at a second point in time, valid data may be present in the first storage region R1 of the first memory block BLK1, and invalid data may be present in the second storage region R2 of the first memory block BLK1. In some implementations, in the first memory block BLK1, a ratio of invalid data to valid data may be great. The memory controller 120 may designate the first memory block BLK1 as a victim block for garbage collection. The memory controller 120 may designate the first memory block BLK1 as a free block. Meanwhile at the second point in time, the program operation of the second memory block BLK2 may be completed. In this case, for example, valid data may be present in the third storage region R3 of the second memory block BLK2, and there may be no data programmed in the fourth storage area R4. Accordingly, the fourth storage area may still be in the normal erase state NE.

Afterwards, at a third point in time, the memory controller 120 may perform migration such that valid data of the first storage region R1 of the first memory block BLK1 migrate to a free block. The migration may include writing original data (e.g., data of the first storage region R1) in a target region and then invalidating the original data (e.g., the data of the first storage region R1). As such, the first memory block BLK1 may be set to the free block.

Meanwhile, the third point in time may be a point in time when the idle reference time passes from the second point in time. In this case, the memory controller 120 may perform the dummy close operation on the second memory block BLK2. Through the dummy close operation, dummy data may be stored in the fourth storage region R4 of the second memory block BLK2. That is, the memory cells of the fourth storage region R4 may have the uppermost program state (e.g., P7).

For example, at a fourth point in time, the memory controller 120 may perform the soft erase operation on the first memory block BLK1. In this case, the memory cells of the first storage region R1 and the second storage region R2 may have the soft erase state nSE. After performing the soft erase operation, the memory controller 120 may measure a cell count of the first memory block BLK1. For example, the cell count may refer to the on-cell count, the cell count may be 300, and the LUT 123 may be implemented like the example illustrated in FIG. 9. In this case, the storage device 100 may generate a first health index of the first memory block BLK1 and may update the health index table 122. As such, in the health index table 122, the health index of the first memory block BLK1 may be set to "D".

Meanwhile, the fourth point in time may be a point in time when the retention reference time passes from the point in time when the dummy close operation is completed. The storage device 100 may measure a cell count of the second memory block BLK2. For example, the cell count may refer to the on-cell count, the cell count may be 110, and the LUT 123 may be implemented like the example illustrated in FIG. 9. In this case, the memory controller 120 may generate a second health index of the second memory block BLK2 and may update the health index table 122. As such, in the health index table 122, the health index of the second memory block BLK2 may be set to "B".

For example, when the LUT 123 is implemented like the example illustrated in FIG. 9, the memory controller 120 may perform the patrol read operation on the first memory block BLK1 every 4 days from the point in time when the storage device 100 is powered on. Also, the memory controller 120 may perform the patrol read operation on the second memory block BLK2 every 10 days from the point in time when the storage device 100 is powered on.

In some implementations, with regard to a memory block (e.g., the first memory block BLK1) designated as a free block, the storage device 100 may generate a health index based on the soft erase operation; with regard to a memory block (e.g., the second memory block BLK2) where the dummy event occurs, the storage device 100 may generate a health index based on the dummy close operation.

The storage device 100 may check a retention characteristic of each memory block based on a health index corresponding to each memory block and the LUT 123. In consideration of the retention characteristics of the memory blocks, the storage device 100 may perform the optimal reliability management operation for each memory block. In other words, the storage device 100 may individually manage the memory blocks without performing an unnecessary operation. Accordingly, according to the present disclosure, a storage device with improved performance and improved reliability and an operating method thereof are provided.

In some implementations, a storage device may measure a cell count of a memory block after performing a soft erase operation. The storage device may generate a health index associated with a retention characteristic of the memory block based on the cell count. The storage device may individually manage memory blocks based on the health index of each of the memory blocks. Accordingly, a storage device with improved performance and improved reliability and an operating method thereof are provided.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. A storage device comprising:

a nonvolatile memory device including a plurality of memory blocks; and a memory controller configured to control the nonvolatile memory device, wherein the memory controller includes:

a health index table including a plurality of reference health indexes corresponding to the plurality of memory blocks; and wherein the memory controller is configured to:

perform a soft erase operation on a first memory block among the plurality of memory blocks;

after performing the soft erase operation, apply a first reference voltage to a plurality of first memory cells to measure a first cell count, wherein the plurality of first memory cells are selected in advance from a plurality of memory cells of the first memory block;

generate a first health index associated with a retention characteristic of the first memory block based on the first cell count; and perform a reliability management operation on the first memory block based on the first health index in response to the first health index and a first reference health index corresponding to the first memory block in the health index table being different.

2. The storage device of claim 1, wherein the memory controller includes:

a health index lookup table including information about a relationship between a plurality of health indexes and a plurality of cell counts, and wherein the memory controller is configured to generate the first health index based on the first cell count and the health index lookup table.

3. The storage device of claim 2, wherein the health index lookup table includes:

information about a relationship between a plurality of execution conditions of the reliability management operation and the plurality of health indexes, wherein the memory controller is configured to:

determine an execution condition of the reliability management operation associated with the first memory block based on the first health index and the health index lookup table.

4. The storage device of claim 1, wherein the memory controller is configured to:

compare the first health index with the first reference health index, corresponding to the first memory block, from the plurality of reference health indexes to obtain a comparison result; and update the first reference health index to the first health index based on the comparison result, and wherein the plurality of reference health indexes indicate a plurality of health indexes generated before the first health index is generated.

5. The storage device of claim 1, wherein the memory controller is configured to operate in an idle mode.

6. The storage device of claim 1, wherein the first memory block is a free block, and wherein the memory controller is configured to:

perform a pre-program operation on the first memory block before performing the soft erase operation.

7. The storage device of claim 6, wherein, after the pre-program operation is performed, the plurality of first memory cells selected in advance have a program state higher than a normal soft erase state.

8. The storage device of claim 7, wherein, when the memory controller is configured to perform the soft erase operation on a normal memory block among the plurality of memory blocks, a plurality of memory cells of the normal memory block have the normal soft erase state immediately after the soft erase operation is performed with respect to the normal memory block, wherein a lower limit value of a threshold voltage distribution of the normal soft erase state is a first value, and the first value is higher than an upper limit value of a threshold voltage distribution of a normal erase state, and wherein the first reference voltage corresponds to the first value.

9. The storage device of claim 8, wherein the first cell count is an on-cell count or an off-cell count of the plurality of first memory cells selected in advance, wherein the on-cell count indicates a number of first memory cells, which are turned on when the first reference voltage is applied thereto, from the plurality of first memory cells selected in advance, and wherein the off-cell count indicates a number of first memory cells, which are turned off when the first reference voltage is applied thereto, from the plurality of first memory cells selected in advance.

10. The storage device of claim 1, wherein the memory controller is configured to:

perform a dummy close operation on a second memory block, different from the first memory block, from the plurality of memory blocks;

after performing the dummy close operation, apply a second reference voltage to a plurality of second memory cells to measure a second cell count, wherein the plurality of second memory cells are selected in advance from a plurality of memory cells of the second memory block;

generate a second health index associated with a retention characteristic of the second memory block based on the second cell count; and perform the reliability management operation on the second memory block based on the second health index.

11. The storage device of claim 10, wherein the plurality of second memory cells include:

at least one data memory cell having one program state of a plurality of program states; and at least one open memory cell having a normal erase state, wherein the dummy close operation includes programming the at least one open memory cell to have an uppermost program state among the plurality of program states, and wherein the uppermost program state is a program state having an uppermost lower limit value being a highest lower limit value among a plurality of lower limit values of a plurality of threshold voltage distributions of the plurality of program states.

12. The storage device of claim 11, wherein the first cell count indicates a number of first memory cells, which are turned on when the first reference voltage is applied thereto, from the plurality of first memory cells selected in advance, and wherein the second cell count indicates a number of second memory cells, which are turned on when the second reference voltage is applied to the plurality of second memory cells selected in advance, after a retention reference time passes from a point in time when the memory controller completes the dummy close operation on the second memory block, and wherein the first reference voltage is a lower limit value of a threshold voltage distribution of a normal soft erase state, and the second reference voltage is the uppermost lower limit value.

13. The storage device of claim 11, wherein, when the first cell count is greater than the second cell count, the memory controller is configured to:

perform the reliability management operation on the first memory block at a first period; and perform the reliability management operation on the second memory block at a second period longer than the first period.

14. An operating method of a storage device, wherein the storage device includes a memory controller and a nonvolatile memory device including a plurality of memory blocks, and the memory controller controls the nonvolatile memory device, the method comprising:

performing a pre-program operation on a first memory block among the plurality of memory blocks;

performing a soft erase operation on the first memory block;

applying a first reference voltage to a plurality of first memory cells to measure a first cell count, wherein the plurality of first memory cells are selected in advance from a plurality of memory cells of the first memory block;

generating a first health index associated with a retention characteristic of the first memory block based on the first cell count; and performing a reliability management operation on the first memory block based on the first health index in response to the first health index and a first reference health index corresponding to the first memory block in a health index table being different.

15. The method of claim 14, wherein the first memory block is a free block, and wherein performing the pre-program operation includes:

adjusting a plurality of threshold voltages of the plurality of first memory cells selected in advance such that the plurality of first memory cells selected in advance have a program state higher than a normal soft erase state.

16. The method of claim 15, wherein a lower limit value of a threshold voltage distribution of the normal soft erase state is a first value, wherein the first value is higher than an upper limit value of a threshold voltage distribution of a normal erase state, and wherein the first reference voltage corresponds to the first value.

17. The method of claim 14, wherein generating the first health index includes:

comparing the first cell count and a plurality of reference values;

comparing the first health index and the first reference health index, corresponding to the first memory block, from a plurality of reference health indexes to obtain a comparison result, the plurality of reference health indexes indicating a plurality of health indexes generated before the first health index is generated; and updating the first reference health index to the first health index based on the comparison result.

18. The method of claim 14, wherein performing the reliability management operation includes:

determining an execution condition of the reliability management operation of the first memory block based on the first health index; and determining whether the first memory block satisfies the execution condition.

19. The method of claim 14, wherein the soft erase operation includes an operation of discharging some of charges stored in a memory block.

20. A storage device comprising:

a nonvolatile memory device including a plurality of memory blocks; and a memory controller configured to control the nonvolatile memory device, wherein the memory controller includes:

a health index table including a plurality of reference health indexes corresponding to the plurality of memory blocks; and a health index lookup table including a plurality of reference values, wherein the memory controller is configured to:

perform a pre-program operation on a first memory block among the plurality of memory blocks;

after performing the pre-program operation, perform a soft erase operation on the first memory block;

after performing the soft erase operation, apply a first reference voltage to a plurality of first memory cells to measure a first cell count, wherein the plurality of first memory cells are selected in advance from a plurality of memory cells of the first memory block;

generate a first health index associated with a retention characteristic of the first memory block based on the first cell count and the plurality of reference values;

compare the first health index with a first reference health index, corresponding to the first memory block, from the plurality of reference health indexes to obtain a comparison result;

update the first reference health index to the first health index based on the comparison result; and perform a reliability management operation on the first memory block based on the first health index.

* * * * *